United States Patent
Shiozawa

(10) Patent No.: US 7,410,826 B2
(45) Date of Patent: Aug. 12, 2008

(54) APPARATUS FOR MANUFACTURING AN ELECTRONIC DEVICE, METHOD OF MANUFACTURING AN ELECTRONIC DEVICE, AND PROGRAM FOR MANUFACTURING AN ELECTRONIC DEVICE

(75) Inventor: Masakuni Shiozawa, Suwa (JP)

(73) Assignee: Seiko Epson Corporation (JP)

( * ) Notice: Subject to any disclaimer, the term of this patent is extended or adjusted under 35 U.S.C. 154(b) by 220 days.

(21) Appl. No.: 11/313,055

(22) Filed: Dec. 20, 2005

(65) Prior Publication Data

US 2006/0096701 A1 May 11, 2006

Related U.S. Application Data

(62) Division of application No. 10/394,478, filed on Mar. 21, 2003, now Pat. No. 7,017,636.

(30) Foreign Application Priority Data

| Mar. 22, 2002 | (JP) | ............................. | 2002-081220 |
| Mar. 22, 2002 | (JP) | ............................. | 2002-081221 |
| Mar. 22, 2002 | (JP) | ............................. | 2002-081222 |
| Mar. 22, 2002 | (JP) | ............................. | 2002-081223 |
| Mar. 25, 2002 | (JP) | ............................. | 2002-084347 |
| Jan. 31, 2003 | (JP) | ............................. | 2003-024649 |

(51) Int. Cl.
*H01L 21/00* (2006.01)

(52) U.S. Cl. ..................... 438/106; 438/108; 438/125; 438/907; 257/E21.001

(58) Field of Classification Search ................. 438/106; 257/E21.001
See application file for complete search history.

(56) References Cited

U.S. PATENT DOCUMENTS

| 3,816,215 | A | 6/1974 | Wethington |
| 4,483,810 | A | 11/1984 | Bunk et al. |
| 4,493,939 | A * | 1/1985 | Blaske et al. ................. 136/212 |
| 6,051,093 | A | 4/2000 | Tsukahara |
| 6,323,454 | B2 | 11/2001 | Mitsuhashi |
| 7,129,446 | B2 * | 10/2006 | Imaoka ........................ 219/388 |
| 2004/0004295 | A1 * | 1/2004 | Stromberg et al. .......... 257/783 |

FOREIGN PATENT DOCUMENTS

| JP | 58-217475 | 12/1983 |
| JP | 06-045405 | 2/1994 |
| JP | 06-063733 | 3/1994 |
| JP | 06-163646 | 6/1994 |
| JP | 06-310849 | 11/1994 |
| JP | 10-135278 | 5/1998 |
| JP | 11-163025 | 6/1999 |
| JP | 2000-246693 | 9/2000 |
| JP | 2000-332063 | 11/2000 |
| JP | 2001-351951 | 12/2001 |
| JP | 2002-026509 | 1/2002 |
| JP | 2002-043370 | 2/2002 |

OTHER PUBLICATIONS

Two communications from Japanese Patent Office re: related applications.
Communication from Korean Patent Office re: counterpart application.

* cited by examiner

*Primary Examiner*—Scott B. Geyer
*Assistant Examiner*—Angel Roman
(74) *Attorney, Agent, or Firm*—Harness, Dickey & Pierce, P.L.C.

(57) ABSTRACT

A mounting zone and a reflow zone are arranged in parallel between a loader and an unloader, and mounting and reflow processes are performed simultaneously.

22 Claims, 21 Drawing Sheets

FIG.10
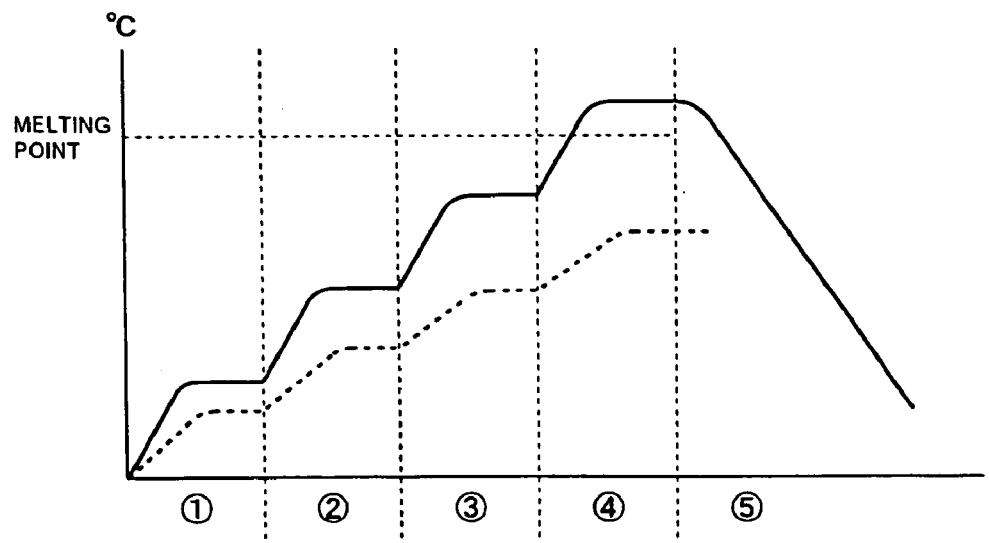
FIG.11
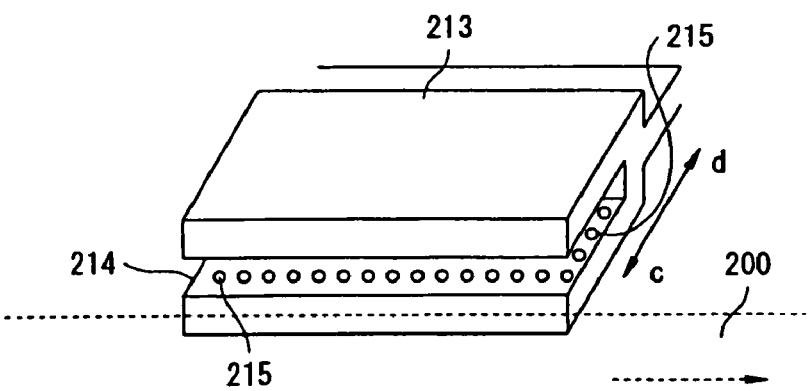
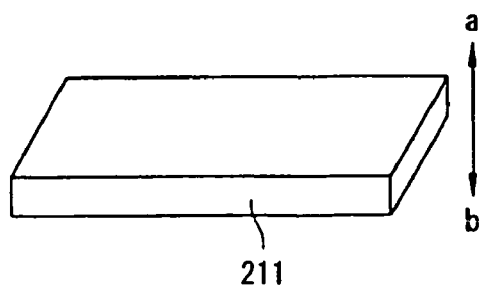

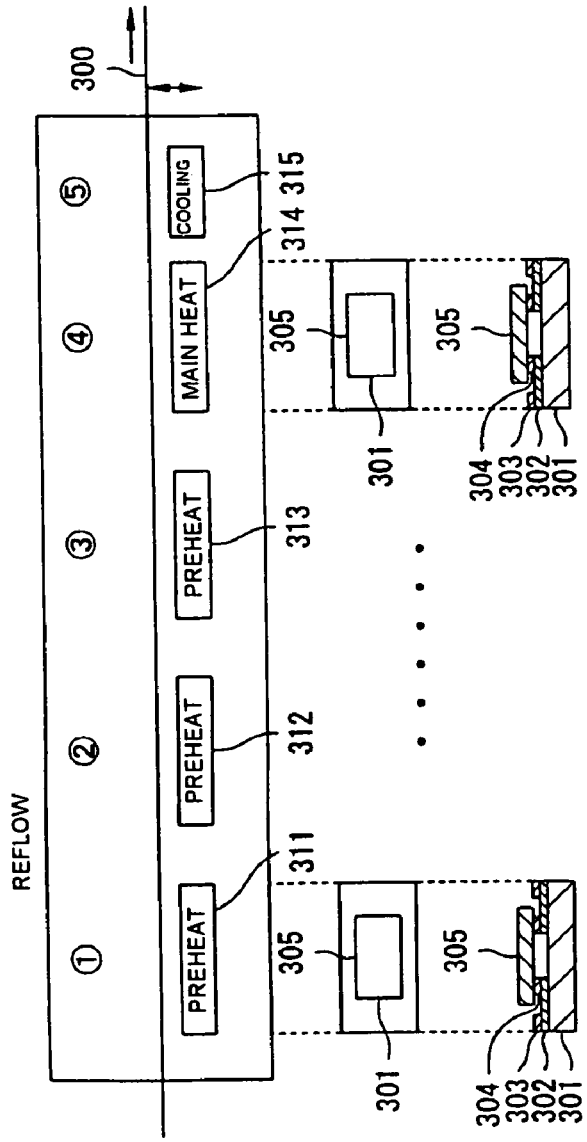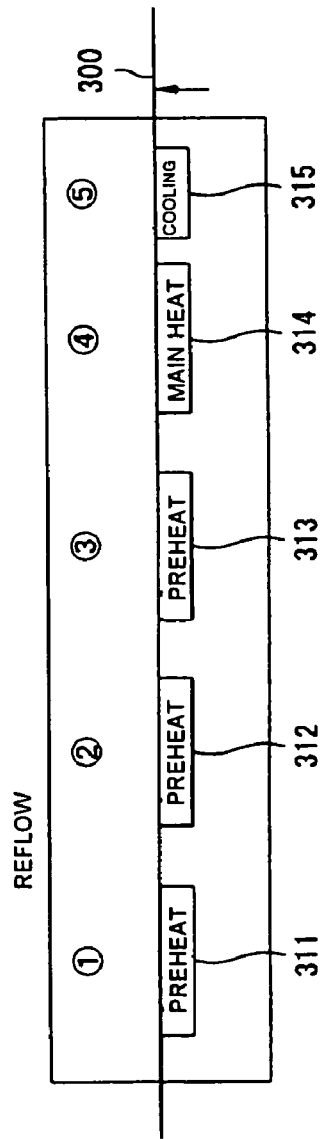
FIG.13 (a)
FIG.13 (b)

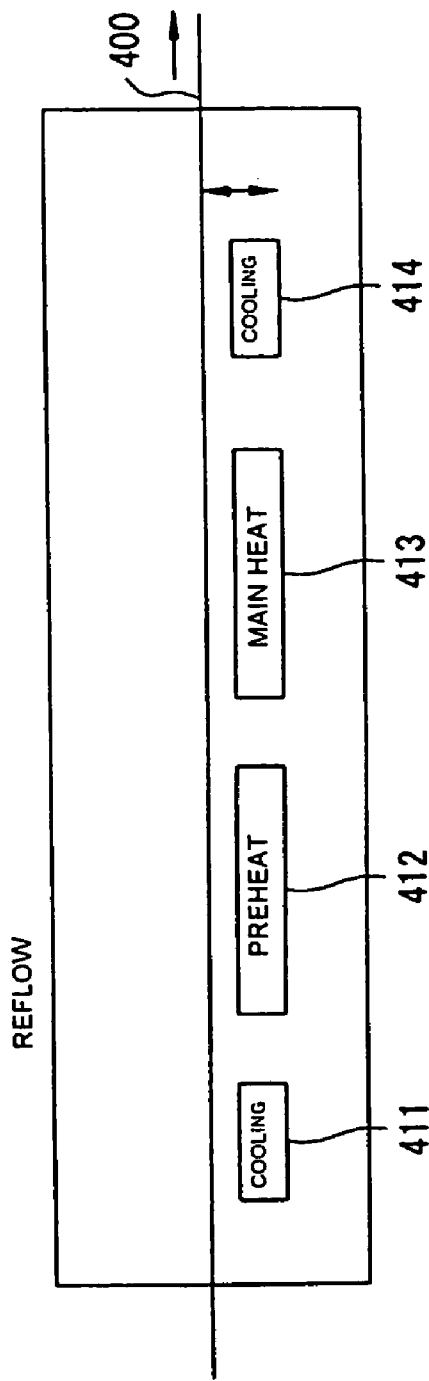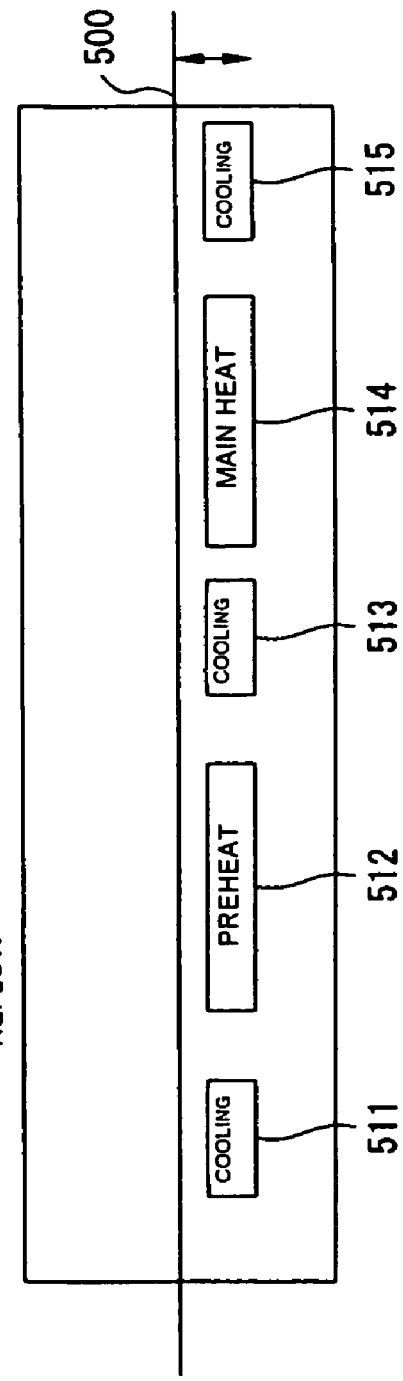
FIG.16 (a)
FIG.16 (b)

APPARATUS FOR MANUFACTURING AN ELECTRONIC DEVICE, METHOD OF MANUFACTURING AN ELECTRONIC DEVICE, AND PROGRAM FOR MANUFACTURING AN ELECTRONIC DEVICE

CROSS-REFERENCE TO RELATED APPLICATIONS

This application is a divisional of U.S. patent application Ser. No. 10/394,478 filed Mar. 21, 2003, now U.S. Pat. No. 7,017,636 claiming priority to JP2002-081220 filed Mar. 22, 2002, JP2002-081221 filed Mar. 22, 2002, JP2002-081222 filed Mar. 22, 2002, JP2002-081223 filed Mar. 22, 2002, JP2002-084347 filed Mar. 25, 2002, and JP2003-024649 filed Jan. 31, 2003. The disclosures of the above applications are incorporated herein by reference.

BACKGROUND OF THE INVENTION

1. Technical Field of the Invention

The present invention relates to an apparatus, a method, and a program for manufacturing an electronic device, and more particularly to a soldering reflow process for a tape substrate, or the like on which electronic components are mounted.

2. Description of the Related Art

Generally, if semiconductor chips are mounted on a circuit substrate of a COF (Chip On Film) module, a TAB (Tape Automated Bonding) module, or the like in a conventional apparatus for manufacturing an electronic device, a method for performing a soldering/printing treatment, an electronic component mounting for performing a soldering/printing treatment, an electronic component mounting treatment, and a reflow treatment in a reel-to-reel method is used.

FIG. 23 illustrates a conventional method of manufacturing an electronic device. In FIG. 23, a solder applying zone 122 is arranged between a loader 121 and an unloader 123, and a mounting zone 132 between a loader 131 and an unloader 133, and a reflow zone 142 between a loader 141 and an unloader 143.

On a tape substrate 220 an electronic component mounting area is provided at each circuit block and a circuit substrate 221 is provided at each circuit block. A wiring 222 is formed on each circuit substrate 221, and an insulating film 223 is formed on the wiring 222 such that a terminal portion of the wiring 222 is exposed.

Furthermore, a tape substrate 220 where a predetermined block length of circuit substrates 221 are placed in a line, extends between an unwinding reel 121a and a take-up reel 123a. Additionally, the tape substrate 220 is transported to the solder applying zone 122 provided between the loader 121 and unloader 123, and a solder paste 224 is printed on the tape substrate 220 at the solder applying zone 122.

Next, when the solder paste 224 is printed to all the circuit substrates 221 which are placed in a line on the tape substrate 220, the tape substrate 220 where the solder paste 224 is printed is hung between the take-up reel 131a and unwinding reel 133a. Then, the tape substrate 220 is continuously transported to the mounting zone 132 provided between the loader 131 and unloader 133, and a semiconductor chip 225 is mounted on the tape substrate 220 at the mounting zone 132.

Next, when the semiconductor chips 225 are mounted to all the circuit substrates 221 placed in a line on the tape substrate 220, the tape substrate 220 where the semiconductor chips 225 is mounted is hung between an unwinding reel 141a and a take-up reel 143a. The semiconductor chips 225 are fixed on the circuit substrate 221 via the solder paste 224 by subsequently transporting the tape substrate 220 to the reflow zone 142 provided between the loader 141 and the unloader 143, performing a reflow treatment to the tape substrate 220 at the reflow zone 142. In addition, air heating by hot-air circulation, lamp heating, or far infrared ray heating methods is adopted at the reflow zone 142.

However, there have been problems in the apparatus for manufacturing an electronic device according to the prior art in that, as transport tacts are not uniform at the solder applying zone 122, mounting zone 132 and reflow zone 142, in order to perform the solder printing, and mounting and reflow of electronic components to one tape substrate 220, it is necessary to transport one tape substrate 220 three times between loaders 121, 131, 141 and unloaders 141, 142, 143, respectively, and the production efficiency is poor.

In other words, if the number of parts to be mounted on the circuit substrate 221 is great, the time required for mounting increases with almost no change in the time required for the solder applying and reflow treatment. Therefore, the transport tact gets longer at the mounting zone 132 than at the solder applying zone 122 and the reflow zone 142.

Moreover, in order to perform a solder applying treatment and a mounting treatment, it is necessary to stop the tape substrate 220 once it is transported to the solder applying zone 122 and mounting zone 132. In the reflow treatment using a reflow furnace, a successive transport process without halting the tape substrate 220 should be performed in the reflow furnace to prevent heating nonuniformity.

Therefore, in the conventional apparatus for manufacturing an electronic device, the transport tacts are different in the solder applying zone 122, mounting zone 132 and reflow zone 142, and the solder printing treatment, electronic component mounting treatment, and reflow treatment are separately performed.

Besides, according to the conventional mounting treatment, it is necessary to have the tape substrate 220 mounted with semiconductor chips 225 taken up by the take-up reel 131a before performing the reflow treatment. Thus, in order to prohibit the semiconductor chips 225 from falling off the tape substrate 220, the semiconductor chips 225 need tacking at the tape substrate 220 which further deteriorates production efficiency.

Thus, it is an object of the present invention to provide an apparatus for manufacturing an electronic device, a method of manufacturing an electronic device and an electronic manufacturing program that can reduce the number of transports of a tape substrate and improve production efficiency.

SUMMARY

In order to solve the aforementioned problems, an apparatus for manufacturing an electronic device according to an aspect of the present invention comprises: transport means for transporting a continuous body having circuit blocks, at each of which an electronic component mounting area is provided; mounting means for mounting an electronic component to the electronic component mounting area of the continuous body; and reflow means for performing a reflow treatment on the continuous body where electronic components are mounted, at the downstream side of the mounting position.

As a result, it is possible to perform the electronic component mounting treatment and reflow treatment at one time while the continuous body is retracted, so that it is possible to avoid the unnecessary process of re-winding the continuous body where the electronic components are mounted and performing the reflow treatment, reduce the number of transports of the tape substrate, eliminate the process of tacking the electronic components and improve the production efficiency.

The apparatus for manufacturing an electronic device according to one aspect of the present invention further comprises a conductive material applying means for applying a conductive material to a predetermined area of the continuous body, at the upstream side of the mounting position.

Therefore, it is possible to perform the conductive material applying treatment, electronic component mounting treatment, and reflow treatment at one time by using the aforementioned conductive material applying means while the continuous body is retracted. As a result, it is possible to mount electronic components on the continuous body by unwinding the continuous body only once, thereby reducing the number of transports of the tape substrate and improving production efficiency.

In the apparatus for manufacturing an electronic device according to one aspect of the present invention, the conductive material applying means applies a conductive material to a plurality of circuit blocks at one time.

Therefore, it is possible to mount electronic components to a plurality of circuit blocks all at once with one transport tact, reduce the number of stops of the tape substrate in performing the conductive material applying treatment, electronic component mounting treatment, and reflow treatment all at once and improve the production efficiency.

In the apparatus for manufacturing an electronic device according to one aspect of the present invention, a plurality of mounting means are provided for dividing and mounting a conductive material applied area applied by the conductive material applying means.

Therefore, it is possible to restrict the enlargement of a mounting unit and reduce a period of mounting time even when the number of parts mounted on respective circuit blocks is great. As a result, it is possible to match the time required for the mounting treatment with that of the conductive material applying treatment and reflow treatment, thereby reducing a period of stand-by time for the next process, even when the conductive material applying process, electronic component mounting process, and reflow process are performed continuously, and improve production efficiency.

The apparatus for manufacturing an electronic device according to one aspect of the present invention further comprises: an unwinding means for unwinding a continuous body transported by the transport means; and a take-up means for taking up the continuous body transported by the transport means.

Thus, it is possible to perform the conductive material applying process, conductive material mounting process, and reflow process all at once while the continuous body is transported between the unwinding and take-up means. As a result, it is possible to mount electronic components on the continuous body by transporting the continuous body between the unwinding and take-up means only once, thereby reducing the number of transports of the tape substrate and improving the production efficiency.

The apparatus for manufacturing an electronic device according to one aspect of the present invention further comprises a cutting means provided in front of the take-up means for cutting the continuous body taken up by the take-up means at each circuit block.

Thus, it is possible to cut the continuous body where the electronic components are mounted at every circuit block without re-winding the continuous body. As a result, it is possible to mount electronic components and cut-out circuit blocks by unwinding the continuous body only once, thereby reducing the number of transports of the tape substrate and improving the production efficiency.

In the apparatus for manufacturing an electronic device according to one aspect of the present invention, the conductive material applying means, the mounting means and the reflow means are arranged in parallel between the unwinding means and the take-up means along a transport direction of the continuous body.

As a result, it is possible to perform the conductive material applying treatment, electronic component mounting treatment, and reflow treatment in parallel to different areas of the continuous body retracted between the unwinding and take-up means thereby reducing a period of time required for mounting electronic components.

The apparatus for manufacturing an electronic device according to one aspect of the present invention further comprises a buffer means provided in front of the reflow means for collecting the continuous body transported to the reflow means in the middle of the process.

Thus, it is possible to accumulate the tape substrate to which the conductive material applying treatment and electronic component mounting treatment are terminated in front part of the reflow means. As a result, even when trouble occurs in front of the reflow means in the conductive material applying process or electronic component mounting process, it is possible to perform the reflow treatment subsequently and efficiently.

The apparatus for manufacturing an electronic device according to one aspect of the present invention further comprises a sealing resin applying means provided in front of the take-up means for applying sealing resin to a predetermined area of the reflowed continuous body; and a curing means for curing the sealing resin at the downstream side of the sealing resin applying position.

Thus, it is possible to perform the resin sealing treatment to the electronic components mounted on the continuous body without re-winding the continuous body where electronic components are mounted. As a result, it is possible to perform a series of treatments from electronic component mounting through resin sealing at one time by taking-up the continuous body only once, thereby reducing the number of transports of the tape substrate and improving production efficiency.

In the apparatus for manufacturing an electronic device according to one aspect of the present invention, the reflow means comprises a heat generating means for raising the temperature of the area to be heated by controlling a distance between the area to be heated of the continuous body and the heat generating means.

Thus, it is possible to readily control the heating state of the area to be heated by controlling the distance between the area to be heated and heat generating means and the temperature of the area to be heated even when the area to be heated is stopped in the course of a transport process. As a result, it is possible to align the transport tact in the conductive material applying process or electronic component mounting process with that in the reflow process, thereby reducing damage to the electronic components or conductive material by restricting rapid changes in temperature during the reflow process, and performing the conductive material applying treatment, electronic component mounting treatment, and reflow treatment at one time while restricting the deterioration of product quality in the reflow treatment.

In the apparatus for manufacturing an electronic device according to one aspect of the present invention, the heat generating means raises the temperature of the area to be heated by approaching or contacting at least a part of the area to be heated of the continuous body.

Thus, it is possible to control the heating state of the area to be heated by radiated heat or conductive heat, precisely control the temperature profile by the unit of a circuit block and eliminate the need for an air shielding structure as in a hot-air circulating method or a light shielding structure as in a lamp heating or far infrared ray method.

As a result, it is possible to perform a reflow treatment by the unit of a circuit block, readily align the transport tact in the conductive material applying process or electronic component mounting process with that in the reflow process, restrict the enlargement of the reflow zone, and perform the conductive material applying treatment, electronic component mounting treatment, and reflow treatment at one time with spatial reduction.

In the apparatus for manufacturing an electronic device according to one aspect of the present invention, the heat generating means makes contact from the back side or the surface side (top or bottom) of the continuous body.

At this time, the heat generating means contacts the back side of the continuous body, so that it is possible to efficiently transfer heat to the continuous body and stably perform the reflow treatment even when electronic components having different heights are arranged on the continuous body.

In addition, since the heat generating means contacts the surface side of the continuous body, the heat generating means can directly contact the electronic components. Therefore, it is possible to prevent the heat generating means from contacting the continuous body and the continuous body from being adhered to the heat generating means.

In the apparatus for manufacturing an electronic device according to one aspect of the present invention, the heat generating means incrementally controls the temperature of the area to be heated step-by-step by controlling the speed or position of movement of the heat generating means relative to the continuous body.

Thus, it is possible to control the temperature of the area to be heated step-by-step without using a plurality of other heat generating means having different temperatures. As a result, it is possible to prevent a rapid change in temperature in performing the reflow treatment to the area to be heated, and restrict the deterioration of product quality in the reflow treatment with spatial reduction.

In the apparatus for manufacturing an electronic device according to one aspect of the present invention, the heat generating means is vertically or horizontally moveable.

At this time, even when the area to be heated is large, it is possible to raise or lower the temperature of the area to be heated step-by-step by making a vertical movement of the heat generating means while the temperature distribution is kept uniform in the area to be heated, and to retract the heat generating means rapidly from the area to be heated while an increase at the area at the reflow zone is restricted.

As a result, even when the transport system is stopped, it is possible to minimize spatial utilization, swiftly protect the area to be heated from thermal damage and restrict the deterioration of product quality in the reflow treatment.

The horizontal movement of the heat generating means makes it possible to match the transport speed of the continuous body with the moving speed of the heat generating means, thereby reducing a difference in the heating temperature caused by a static position of the area to be heated and maintaining the uniformity of heating time even in the case of a difference in product pitches.

In the apparatus for manufacturing an electronic device according to one aspect of the present invention, the heat generating means contacts an identical area to be heated a plurality of times.

Thus, it is possible to avoid thermal damage to the area to be heated. As a result, even when the heat generating means is retracted, it is possible to readily return the temperature of the area to be heated to its original level, while the temperature of the area to be heated is prevented from making a rapid change in temperature, thereby reducing the spatial utilization and restricting the deterioration of product quality in the reflow treatment.

In the apparatus for manufacturing an electronic device according to one aspect of the present invention, the heat generating means has a larger contact area than the conductive material applied area applied by the conductive material applying means, and raises the temperature of a plurality of circuit blocks at one time.

As a result, it is possible to perform the reflow treatment to a plurality of circuit blocks all at once by causing the area to be heated to make contact with the heat generating means and perform the reflow treatment without a change of the heat generating means even in the case of a difference in product pitches.

In the apparatus for manufacturing an electronic device according to one aspect of the present invention, the heat generating means includes a plurality of contact areas having different predetermined temperatures, and raises the temperature of the area to be heated step-by-step by sequentially causing the contact areas to make contact with the area to be heated.

As a result, it is possible to raise the temperature of the area to be heated step-by-step by causing the heat generating means to make contact with the area to be heated, control a temperature profile step-by-step by the unit of circuit blocks, and make unnecessary an air shielding structure as in a hot-air circulating method or a light shielding structure as in a lamp or far infrared ray heating method.

As a result, it is possible to perform the reflow treatment by the unit of the circuit blocks while a rapid change in temperature is prevented in performing the reflow treatment to the area to be heated, match a transport tact in the conductive material applying process or electronic component mounting process with that in the reflow process while the product deterioration is restricted in the reflow treatment, and perform the conductive material applying treatment, electronic component mounting treatment, and reflow treatment all at once without any deterioration of product quality.

In the apparatus for manufacturing an electronic device according to one aspect of the present invention, the plurality of contact areas having different predetermined temperatures are arranged in parallel along the transport direction of the continuous body.

Thus, it is possible to make the areas to be heated in contact with the plurality of contact areas having different predetermined temperatures in sequence by transporting the continuous body, raise the temperature of the area to be heated step-by-step without making a movement of the heat generating means, and perform the reflow treatment to the plurality of areas to be heated all at once.

As a result, it is possible to efficiently perform the reflow treatment, while a rapid change is prevented in the temperature of the area to be heated in performing the reflow treatment, and perform the conductive material applying treatment, electronic component mounting treatment, and reflow treatment all at once while a restriction is made to any deterioration of product quality in the reflow treatment.

In the apparatus for manufacturing an electronic device according to one aspect of the present invention, a gap is provided between the contact areas having different predetermined temperatures.

Thus, it is possible to distinctively maintain the difference in temperature at the borders of contact areas having different predetermined temperatures and precisely control the temperature profile of each area to be heated, thereby improving the product quality in the reflow treatment.

In the apparatus for manufacturing an electronic device according to one aspect of the present invention, a plurality of contact areas having different predetermined temperatures can be moved individually.

Thus, it is possible to stop a main heat-up process to the other circuit blocks while a preliminary heat-up process to a specific circuit block is continuously made. As a result, it is possible to prevent the preliminary heat-up process from being stopped even when the main heat-up process is stopped in the middle and reduce the deterioration of product quality.

In the apparatus for manufacturing an electronic device according to one aspect of the present invention, the heat generating means has a plurality of contact areas having different lengths corresponding to a plurality of product pitches and the contact areas are selected in correspondence with the product pitches.

Therefore, it is possible to make the heat generating means in contact with areas to be heated by a unit of circuit blocks even in case of different product pitches of the circuit blocks and improve the product quality in the reflow treatment by precisely controlling the temperature profile of respective circuit blocks.

The apparatus for manufacturing an electronic device according to one aspect of the present invention further comprises a shutter means which is insertable and extractable between the area to be heated of the continuous body and the heat generating means.

Thus, it is possible to restrict the continuous heat-up of the area to be heated with radiant heat of the heat generating means when the area to be heated is removed from the heat generating means, and restrict thermal damage to the area to be heated even if the escape time from heating is prolonged.

The apparatus for manufacturing an electronic device according to one aspect of the present invention further comprises a timer means for tracking the heating time of the area to be heated with the heat generating means, and retracting means for retracting the heat generating means from the area to be heated when the heating time exceeds a predetermined period of time.

Thus, it is possible to rapidly avoid thermal damage to the area to be heated even when a transport system is stopped due to trouble in the course of the heat-up treatment to the area to be heated, and restrict a deterioration of product quality in the reflow treatment.

The apparatus for manufacturing an electronic device according to one aspect of the present invention further comprises a supporting stand for supporting the heat generating means; and a slide means for sliding the supporting stand along the transport direction of the continuous body.

Thus, it is possible to match the position of the heat generating means with a product pitch, while the position of the heat generating means is visually inspected, and maintain the uniformity of heating time even in case of different product pitches.

The apparatus for manufacturing an electronic device according to one aspect of the present invention further comprises a auxiliary heating means for heating up the area to be heated of the continuous body from a direction different from that of the heat generating means.

Thus, it is possible to maintain the temperature of the area to be heated above a predetermined level of temperature, even when the area to be heated is removed from the heat generating means, and prevent defects of a product from being produced due to excessively lowering the temperature of the area to be heated.

The apparatus for manufacturing an electronic device according to one aspect of the present invention further comprises a temperature lowering means for lowering the temperature of the area to be heated, the temperature of which is raised by the heat generating means.

Thus, it is possible to rapidly lower the temperature of the area to be heated, the temperature of which is raised by the heat generating means, stabilize a bonding force by increasing the wettability of conductive material, and prevent the thermal oxidation of conductive material.

In the apparatus for manufacturing an electronic device according to one aspect of the present invention, the temperature lowering means includes a flat plate member having a plurality of coolant blowout holes at a side facing the area to be heated.

Thus, it is possible to help a coolant evenly spread to every corner of the area to be heated, even when electronic components are mounted on the area to be heated, and efficiently lower the temperature of the area to be heated.

In the apparatus for manufacturing an electronic device according to one aspect of the present invention, the temperature lowering means includes a covering and sandwiching opening having a U-shaped cross-section for covering and sandwiching the area to be heated from the vertical direction of its thickness (top and bottom), and a plurality of coolant blowout holes formed inside the covering and sandwiching opening.

Thus, it is possible to cool down the area to be heated from the surface side and back side of the area to be heated and efficiently lower the temperature of area to be heated.

In the apparatus for manufacturing an electronic device according to one aspect of the present invention, the temperature lowering means includes a lower temperature area than the heat generating means, and lowers the temperature of the area to be heated by contacting the lower temperature area with at least one part of the area to be heated of the continuous body.

Thus, it is possible to control the cool state of the area to be heated by heat conduction and shorten a period of cool-off time by improving the cooling efficiency.

As a result, it becomes possible to readily match a transport tact of the heating process in the reflow process with that of the cooling process in the reflow process and perform the conductive material applying treatment, electronic component mounting treatment, and reflow treatment all at once while the thermal oxidation of the conductive material is restricted.

In the apparatus for manufacturing an electronic device according to one aspect of the present invention, the lower temperature area has a larger contact area than the conductive material applied area applied by the conductive material applying means, and the temperature lowering means lowers the temperature of a plurality of circuit blocks at one time.

Thus, it is possible to perform cooling treatment to a plurality of circuit blocks all at once by causing the area to be heated to make contact with the lower temperature area of the temperature lowering means and perform cooling treatment without a change of the temperature lowering means, even in case of different product pitches and improve the production efficiency.

In the apparatus for manufacturing an electronic device according to one aspect of the present invention, the lower temperature areas are arranged in parallel at the front part or rear part of the heat generating means or between the front and rear parts (or a pair) of the heat generating means.

Thus, it is possible to get the area to be heated in contact with the lower temperature area than the heat generating means by transporting the continuous body, lower the temperature of the area to be heated while the lower temperature area cooler than the heat generating means is fixed, and perform a cooling treatment to the plurality of the area to be heated all at once.

As a result, it is possible to perform the cooling treatment efficiently, restrict thermal oxidation of the conductive material, and perform the conductive material applying treatment, electronic component loading treatment, and reflow treatment all at once.

The lower temperature areas of the temperature lowering means are arranged in parallel at the front part of the heat generating means or between heat generating means for preventing the heat generated from the heat generating means from traveling to a portion of the temperature lowering means to which heat is not applied, maintaining the temperature profile of the area to be heated extremely precisely and improving the product quality in the reflow treatment.

In the apparatus for manufacturing an electronic device according to one aspect of the present invention, the lower temperature area includes a plurality of contact areas having different lengths corresponding to a plurality of product pitches, and the temperature lowering means selects the contact areas in correspondence with the product pitches.

As a result, it is possible to get the lower temperature area than the heat generating means in contact with the area to be heated in a circuit block unit, even when the circuit blocks have different product pitches, control the temperature profile of the each circuit block very precisely, and improve the product quality in the reflow treatment.

A method for manufacturing an electronic device according to one aspect of the present invention comprises a step of performing an electronic component mounting treatment, and a reflow treatment in parallel on a continuous body retracted between unwinding and take-up sides, the continuous body having circuit blocks, at each of which an electronic component mounting area is provided.

As a result, it is possible to simultaneously perform the electronic component mounting treatment and reflow treatment at other areas of the continuous body and perform the reflow treatment while the electronic component mounting treatment is carried out on the same continuous body. Thus, it also is possible to perform the electronic component mounting treatment and reflow treatment by transporting the continuous body between the unwinding and take-up sides only once, start the reflow treatment on the same continuous body without terminating the electronic component mounting treatment to all the circuit blocks of the continuous body and improve the production efficiency.

A method for manufacturing an electronic device according to one aspect of the present invention comprises a step of performing at least one of a conductive material applying treatment, a resin sealing treatment, and a circuit block cutting-out treatment in parallel, on the continuous body retracted between the unwinding side and the take-up side.

As a result, it is possible to perform a series of treatments from the electronic component mounting treatment through the resin sealing treatment or cutting-out treatment of the circuit block at one time, reduce the number of transports of the tape substrate and improve the production efficiency.

A method for manufacturing an electronic device according to one aspect of the present invention comprises the steps of moving an electronic component unmounted area of a continuous body to a mounting zone and moving to a reflow zone an electronic component mounting-finished area of the continuous body, to which an electronic component is mounted in the mounting zone, by transporting the continuous body having circuit blocks, at each of which an electronic component mounting area is provided; mounting an electronic component to the unmounted area of the continuous body in the mounting zone; and performing a reflow treatment on the electronic component mounting-finished area of the continuous body in the reflow zone.

Therefore, it is possible to perform an electronic component mounting treatment and a reflow treatment all at once, while the continuous body is retracted, reduce the stand-by time of the electronic component mounting treatment until the reflow treatment is made available to the same continuous body, and improve the production efficiency.

A method for manufacturing an electronic device according to one aspect of the present invention comprises the steps of moving a conductive material unapplied area of a continuous body to a conductive material applying zone, moving to a mounting zone a conductive material applying-finished area of the continuous body to which a conductive material is applied in the conductive material applying zone, and moving to a reflow zone an electronic component mounting-finished area of the continuous body at which an electronic component is mounted, by transporting the continuous body having circuit blocks, at each of which an electronic component mounting area is provided; applying a conductive material to the conductive material unapplied area of the continuous body in the conductive material applying zone; mounting an electronic component to the conductive material applying-finished area of the continuous body in the mounting zone; and performing a reflow treatment on the electronic component mounting-finished area of the continuous body in the reflow zone.

As a result, it is possible to perform the conductive material applying treatment, the electronic component mounting treatment and the reflow treatment at one time while the continuous body is retracted, reduce the stand-by time of the conductive material applying treatment until an electronic component mounting treatment is made available and that of the electronic component mounting treatment until a reflow treatment is made available, and improve the production efficiency.

In the a method for manufacturing an electronic device according to one aspect of the present invention, the reflow treatment raises the temperature of the area to be heated by making the heat generating means approach or contact at least one part of the area to be heated of the continuous body.

As a result, it is possible to control the heating state of the area to be heated with radiated heat or conductive heat and make a swift control of the temperature of the area to be heated.

Therefore, it is possible to readily avoid thermal damage to the area to be heated, perform the reflow treatment to the area to be heated, while the transport tact in the conductive material applying process matches with that in the electronic component mounting process, maintain the product quality good in the reflow treatment, and perform the conductive material applying treatment, electronic component mounting treatment, and reflow treatment at one time.

The method for manufacturing an electronic device according to one aspect of the present invention comprises a step of contacting a plurality of circuit blocks to the heat generating means at one time.

Thus, it is possible to perform the reflow treatment to the plurality of circuit blocks at one time by contacting the area to be heated to the heat generating means and improve the production efficiency.

The method for manufacturing an electronic device according to one aspect of the present invention comprises a step of contacting the same circuit block to the heat generating means a plurality of times.

Therefore, because thermal damage is avoided in the area to be heated, it is possible to readily return the area to be heated to its original state of temperature, and prevent a rapid change in temperature even in case of separate heat generating means, reduce space requirements (spatial utilization) and restrict the deterioration of product quality in the reflow treatment.

In the method for manufacturing an electronic device according to one aspect of the present invention, the reflow treatment includes the steps of transporting a first area to be heated of the continuous body to the heat generating means; raising the temperature of the first area to be heated by contacting the first area to be heated, which is transported to the heat generating means with the heat generating means; transporting a second area to be heated of the continuous body to the heat generating means; and raising the temperature of the second area to be heated by contacting the transported second area to be heated, which is transported to the heat generating means, with the heat generating means.

As a result, it is possible to contact the area to be heated to the heat generating means by transporting the continuous body to the heat generating means. Therefore, it is possible to improve the efficiency of the reflow treatment, perform the conductive material applying treatment and electronic component mounting treatment at one time and improve the production efficiency.

In the method for manufacturing an electronic, device according to one aspect of the present invention, the reflow treatment includes the steps of transporting the area to be heated of the continuous body to the heat generating means; and incrementally raising the temperature of the area to be heated step-by-step by making the heat generating means approach the area to be heated, which is transported to the heat generating means.

Thus, a heat generating means having a constant temperature is utilized to make it possible to raise the temperature of the area to be heated step-by-step, reduce the use of space and restrict thermal damage in performing the reflow treatment.

The method for manufacturing an electronic device according to one aspect of the present invention comprises a step of retracting the heat generating means from the area to be heated after or in the middle of the process of heating up the area to be heated with the heat generating means.

Therefore, it is possible to swiftly avoid thermal damage to the area to be heated, even when the transport system stops in the middle of the process of heating the area to be heated, and restrict the deterioration of product quality in the reflow treatment.

The method for manufacturing an electronic device according to one aspect of the present invention comprises a step of inserting a heat shielding plate between the retracted heat generating means and the area to be heated.

Therefore, it is possible to restrict thermal damage to the area to be heated by refracting the heat generating means from the area to be heated by a sufficient distance to insert a heat shielding plate between the heat generating means and the area to be heated, reduce the use of space, and restrict the deterioration of product quality in the reflow treatment.

The method for manufacturing an electronic device according to one aspect of the present invention comprises the step of re-contacting the heat generating means, which is retracted from the area to be heated, with the area to be heated.

Since the area to be heated is avoided from thermal damage, it is possible to readily return the area to be heated to its original temperature while the area to be heated is prevented from a rapid change in temperature even when the heat generating means is retracted.

The method for manufacturing an electronic device according to one aspect of the present invention comprises the step of blowing hot air toward (against) the area to be heated before re-contacting the heat generating means, which is retracted from the area to be heated, with the area to be heated.

Therefore, it is possible to maintain the area to be heated above a predetermined temperature even when the area to be heated is retracted from the heat generating means and prevent product defects.

In the method for manufacturing an electronic device according to one aspect of the present invention, the reflow treatment comprises the steps of respectively transporting the first area to be heated of the continuous body to the first heat generating means and the second area to be heated of the continuous body to the second heat generating means, the temperature of which is higher than that of the first one; and raising the temperature of the first area to be heated by contacting the first area to be heated, which is transported to the first heat generating means, with the first heat generating means and the temperature of the second area to be heated higher than the first area to be heated by contacting the second area to be heated, which is transported to the second heat generating means, with the second heat generating means.

Therefore, it is possible to raise the temperature of a plurality of areas to be heated step-by-step at one time by transporting the continuous body, restrict thermal damage in the reflow treatment, and improve swiftness of the reflow treatment.

As a result of the aforementioned process, it is possible to prevent transportation of a continuous body from being rate-limited in the reflow treatment, restrict the deterioration of product quality in the reflow treatment, maintain the product quality and improve production efficiency.

In the method for manufacturing an electronic device according to one aspect of the present invention, the first and second heat generating means are arranged in parallel along the transport direction of the continuous body such that the first heat generating means becomes a front part.

Thus, it is possible to contact a plurality of areas to be heated to the plurality of heat generating means having different predetermined temperatures at one time by transporting the continuous body and raising the temperature of the plurality of areas to be heated step-by-step at one time without movement of the heat generating means.

As a result, it is possible to efficiently perform the reflow treatment while the area to be heated is prevented from a rapid change in temperature in performing the reflow treatment and perform the conductive material applying treatment, electronic component mounting treatment and reflow treatment one time while the deterioration of product quality is restricted in the reflow treatment.

The method for manufacturing an electronic device according to one aspect of the present invention comprises the step of retracting the second heat generating means from the second area to be heated with the first heat generating means in contact with the first area to be heated after or while the areas to be heated are heated by the first and second heat generating means.

As a result, it is possible to swiftly avoid thermal damage to the second area to be heated while the first area to be heated is kept constant at a certain temperature, even when the transport system stops in the middle of the process of heating the plurality of areas to be heated, and restricts the deterioration of product quality in the reflow treatment, even in case of different heating states of the areas to be heated.

The method for manufacturing an electronic device according to one aspect of the present invention comprises the step of again contacting the second heat generating means, which is retracted from the second area to be heated, with the second area to be heated.

As a result, it is possible to return the second area to be heated to its original temperature without any influence on the temperature of the first area to be heated, even when the second heat generating means is retracted from the second area to be heated because thermal damage to the second area to be heated is avoided, and re-start the reflow treatment without any product defects.

The method for manufacturing an electronic device according to one aspect of the present invention comprises the step of blowing hot air against the second area to be heated before again contacting the second heat generating means, which is retracted from the second area to be heated, with the second area to be heated.

Therefore, it is possible to maintain the second areas to be heated above a predetermined level of temperature even when the second area to be heated is retracted from the second heat generating means because the thermal damage to the second area to be heated is avoided, and to prevent product defects.

The method for manufacturing an electronic device according to one aspect of the present invention comprises the step of adjusting the length of the heat generating means such that the length of the heat generating means corresponds to a product pitch.

As a result, it is possible to contact the heat generating means to the areas to be heated in a circuit block unit and perform the heating uniformly to the respective circuit block.

The method for manufacturing an electronic device according to one aspect of the present invention comprises the step of sliding a supporting stand supporting the heat generating means along the transport direction of the continuous body such that the position of the heat generating means corresponds to the product pitch.

As a result, it is possible to match the position of the heat generating means with a product pitch, while it is visually inspected, and maintain the uniformity of heating time even in case of different product pitches.

The method for manufacturing an electronic device according to one aspect of the present invention comprises the step of lowering the temperature of the area to be heated, the temperature of which is raised by the heat generating means.

As a result, it is possible to rapidly lower the temperature of the area to be heated whose temperature is raised by the heat generating means, improve the wettability of the conductive material, and stabilize a bonding state of the conductive material, and to prevent thermal oxidation by preventing the heat treatment from being kept at a high level of temperature for a long period of time.

The method for manufacturing an electronic device according to one aspect of the present invention comprises the step of lowering the area to be heated by contacting a lower temperature area than the heat generating means with at least a part of the area to be heated, the temperature of which is raised by the heat generating means.

As a result, it is possible to control the cooling state of the area to be heated by way of heat conduction, improve cooling efficiency and shorten cooling time. Therefore, it is possible to prevent the deterioration of conductive materials in the reflow treatment, and to perform the conductive material applying treatment, electronic component mounting treatment and reflow treatment at one time.

In the method for manufacturing an electronic device according to one aspect of the present invention, the lower temperature area is arranged at the front part or rear part of the heat generating means or between the front and rear parts of the heat generating means.

As a result, it is possible to contact the area to be heated to the lower temperature area by transporting the continuous body, improve the exactness of matching the transport tacts in the course of the conductive material applying treatment, electronic component mounting treatment, and reflow treatment, and efficiently perform cooling treatment in the reflow.

Furthermore, when the lower temperature area than the heat generating means is arranged in parallel at the front part or rear part of the heat generating means or between the heat generating means, it is possible to shield the heat generated from the heat generating means at the borders of the heat generating means, distinctly keep the different temperatures at the borders of the heat generating means and improve the product quality in the reflow treatment.

The method for manufacturing an electronic device according to one aspect of the present invention comprises the step of lowering the temperature of the area to be heated by blowing gas against one or both sides of the area to be heated, the temperature of which is raised by the heat generating means.

As a result, it is possible to evenly spread coolant to every corner of the area to be heated, even when electronic components are mounted to the area to be heated, and efficiently lower the temperature of the area to be heated.

A program for manufacturing an electronic device according to one aspect of the present invention, makes a computer execute the steps of intermittently transporting a continuous body having circuit blocks, to each of which an electronic component area is provided; and performing an electronic component mounting treatment, and a reflow treatment at one time on the transported continuous body.

Therefore, it is possible to integrally perform the electronic component mounting treatment, and reflow treatment by the installation of the program for manufacturing an electronic device and efficiently manufacture an electronic device by reducing the stand-by time of the electronic component mounting treatment before the performance of the reflow treatment.

The program for manufacturing an electronic device according to one aspect of the present invention, makes a computer execute the step of performing at least one of a conductive material applying treatment, a resin sealing treatment and a circuit block cutting-out treatment at one time on the transported continuous body.

Therefore, it is possible to integrally perform the conductive material applying treatment, resin sealing treatment and cutting-out treatment of circuit blocks by the installation of the program for manufacturing an electronic device, and simultaneously perform a plurality of treatments on the continuous body where circuit blocks are placed in a line, so as to efficiently manufacture an electronic device.

BRIEF DESCRIPTION OF THE DRAWINGS

FIG. 10 illustrates a temperature profile of the reflow treatment of FIG. 7.

FIG. 11 illustrates an apparatus for manufacturing an electronic device according to a seventh embodiment of the present invention.

FIGS. 13(a) and (b) illustrate a method of manufacturing an electronic device according to an eighth embodiment of the present invention.

FIGS. 16(a) and (b) illustrate a method of manufacturing an electronic device according to a tenth embodiment of the present invention.

DETAILED DESCRIPTION

Hereinafter, an apparatus for manufacturing an electronic device and its manufacturing method according to the embodiments of the present invention will be described with reference to accompanying drawings.

Figure 1:
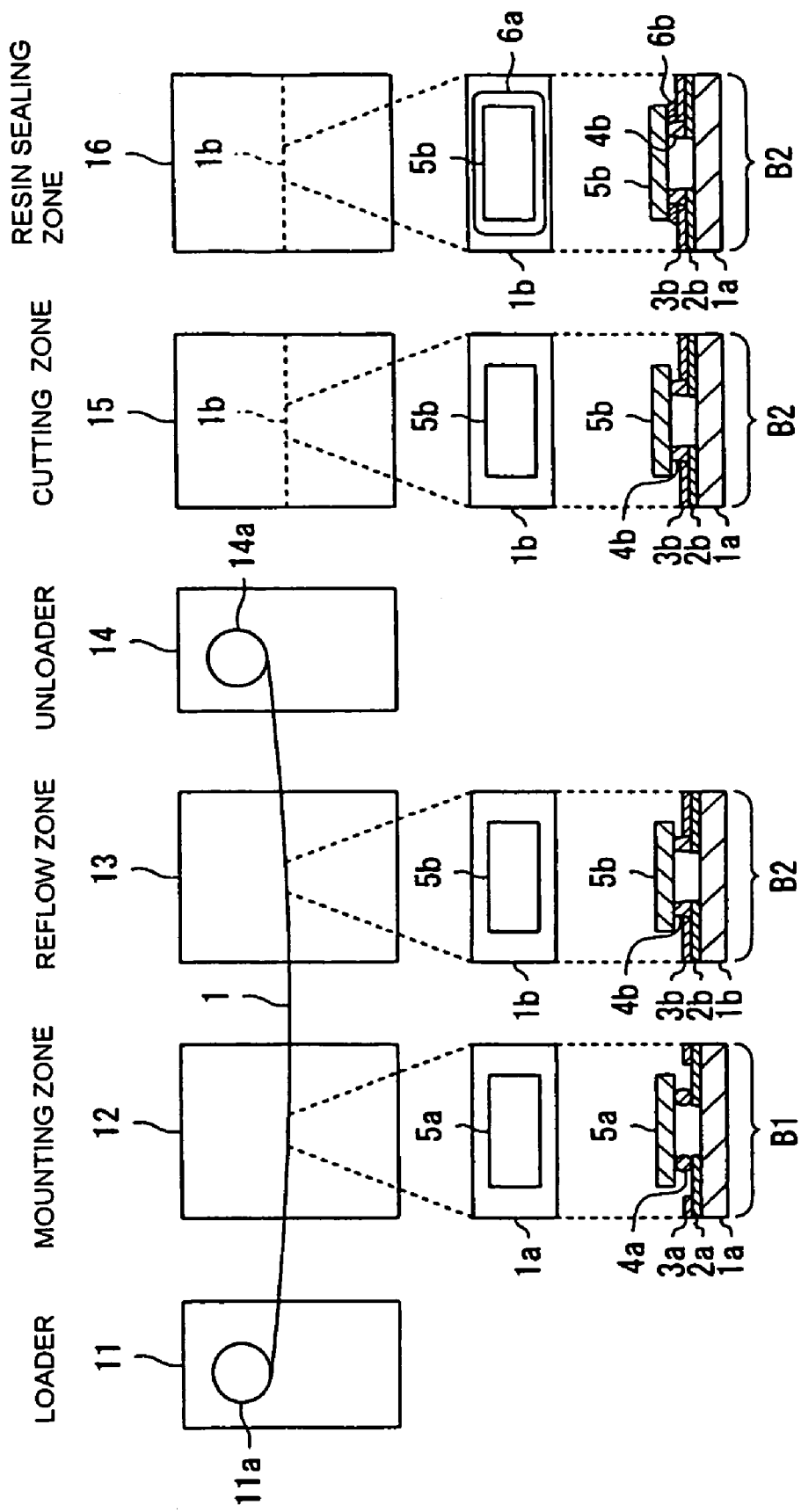
FIG. 1 illustrates a method of manufacturing an electronic device according to a first embodiment of the present invention.

FIG. 1 is a diagram for illustrating a method of manufacturing an electronic device according to an embodiment of the present invention.

In FIG. 1, a mounting zone 12 and reflow zone 13 are arranged in parallel between a loader 11 and an unloader 14 along the transport direction of a tape substrate 1.

On the other hand, in the tape substrate 1, an electronic component mounting area is respectively provided at each of the circuit blocks B1 and B2, and circuit substrates 1a and 1b are respectively provided in the circuit blocks B1 and B2. Besides, wirings 2a and 2b are respectively formed on the circuit substrates 1a and 1b, and insulating films 3a, 3b are respectively formed on the wirings 2a and 2b with exposure of terminals of the wirings 2a and 2b. In addition, soldering material balls 4a and 4b are respectively formed on the semiconductor chips 5a, 5b.

Furthermore, a tape substrate 1 where a predetermined length of circuit substrates 1a and 1b placed in line is hung (i.e., extends) between an unwinding reel 11a and a take-up reel 14a. Then, at each transport tact of the tape substrate 1, an unmounted area of the tape substrate 1 is transported to a mounting zone 12 provided between the loader 11 and unloader 14 and the mounting-finished area of the tape substrate 1 is transported to a reflow zone 13 arranged sequentially in parallel to the mounting zone 12.

In the mounting zone 12, the semiconductor chip 5a where the soldering material ball 4a is formed is mounted to the circuit substrate 1a, and in the reflow zone 13, the semiconductor chip 5b is fixed on the circuit substrate 1b via the soldering material ball 4b by performing the reflow treatment to the circuit substrate 1b where the semiconductor chip 5b is mounted.

When the mounting and reflow treatments to all the circuit blocks B1 and B2 of the tape substrate 1 are finished, the tape substrate 1 is cut at each of the circuit blocks B1 and B2 in a cutting zone 15. The cut circuit blocks B1 and B2 are respectively transported to a resin sealing zone 16, where, for instance, the circuit block B2 is resin-sealed by applying the sealing resin 6b around the semiconductor chip 5b.

Figure 2:
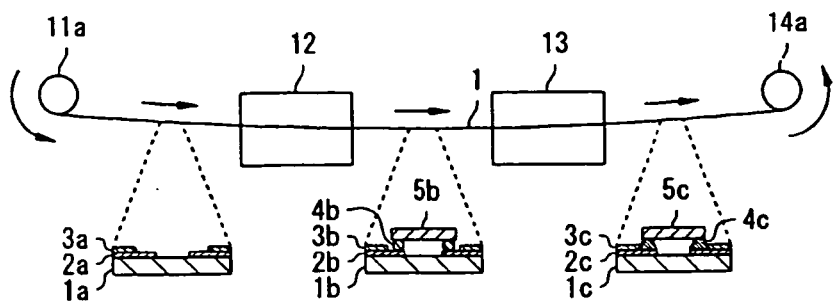
FIGS. 2(a)-(e) illustrate a process for manufacturing an electronic device according to the first embodiment of the present invention.
Figure 2:
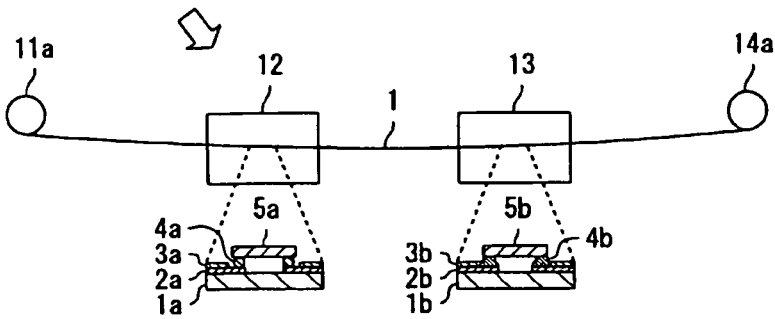
Figure 2:
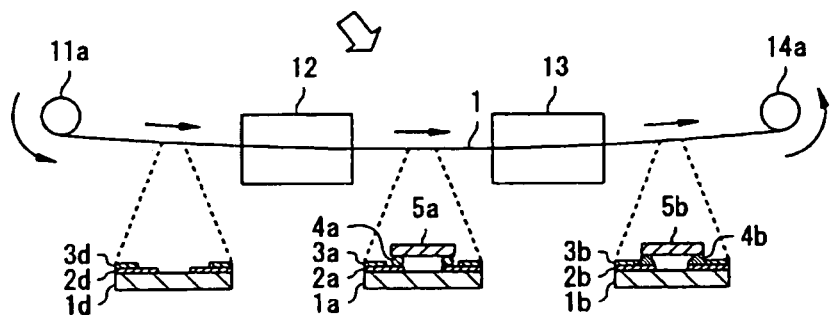
Figure 2:
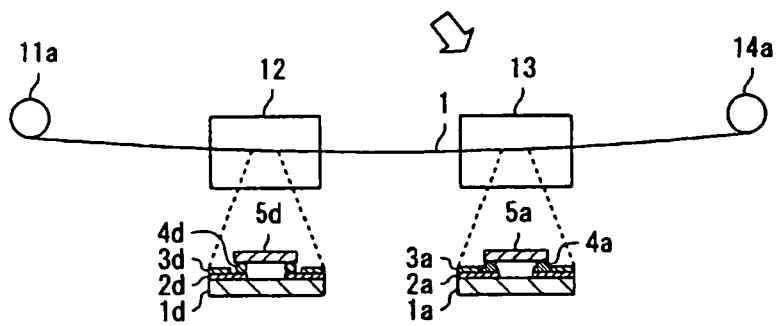
Figure 2:
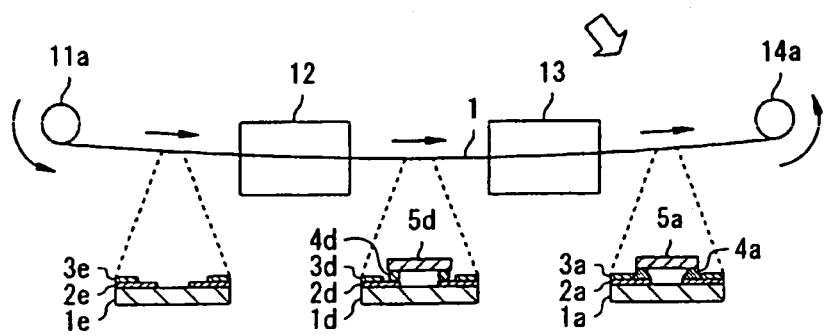

FIG. 2 is a diagram for illustrating an electronic device manufacturing process according to a first embodiment of the present invention;

In FIG. 2(a), circuit substrates 1a to 1c are formed on the tape substrate 1 retracted between the unwinding reel 11a and a take-up reel 14a. At this time, a wiring 2a and an insulating film 3a are formed on the circuit substrate 1a. A wiring 2b and an insulating film 3b are formed on the circuit substrate 1b, and a semiconductor chip 5b where the soldering material ball 4b is formed is mounted on the circuit substrate 1b, a wiring 2c and an insulating film 3c are formed on the circuit substrate 1c, and a semiconductor chip 5c is fixed via the soldering material ball 4c. Moreover, in the tape substrate 1, with the circuit substrate 1a to 1c retracted, according to a predetermined transport tact, the circuit substrate 1a to which the mounting treatment has not been performed yet is transported to the mounting zone 12, and the circuit substrate 1b to which the mounting treatment is performed is transported to the reflow zone 13. The circuit substrate 1c to which the reflow treatment is performed is taken up to a take-up reel 14a.

Next, as shown in FIG. 2(b), when the circuit substrate 1a prior to the mounting treatment is transported to the mounting zone 12 and the circuit substrate 1b after the mounting treatment is transported to the reflow zone 13, the tape substrate 1 stops being transported once. Then, the semiconductor chip 5a having the solder ball 4a is mounted on the circuit substrate 1a transported to the mounting zone 12, and the semiconductor chip 5b is fixed on the circuit substrate 1b transported to the reflow zone 13 as the solder ball 4b is melt. At this time, since the mounting zone 12 and reflow zone 13 are arranged consecutively in parallel, it is possible to perform the reflow treatment to the circuit substrate 1b without any stand-by time up to completion of the mounting treatment of the circuit substrate 1a and improve the production efficiency.

Next, when the mounting treatment of the circuit substrate 1a and the reflow treatment to the circuit substrate 1b are completed, the circuit substrate 1d retracted from the unwinding reel 11a is transported to the mounting zone 12 according to a predetermined transport tact, as shown in FIG. 2(c), the circuit substrate 1a after the mounting treatment is transported to the reflow zone 13 and the circuit substrate 1b after the reflow treatment is taken up to a take-up reel 14a.

Next, as shown in FIG. 2(d), when the circuit substrate 1d prior to the mounting treatment is transported to the mounting zone 12 and the circuit substrate 1a after the mounting treatment is transported to the reflow zone 13, the tape substrate 1 stops being transported once. Then, the semiconductor chip 5d having solder ball 4d is mounted on the circuit substrate 1d transported to the mounting zone 12, and the semiconductor chip 5a is fixed on the circuit substrate 1a transported to the reflow zone 13 as the solder ball 4a is melted. At this time, since the mounting zone 12 and reflow zone 13 are arranged in consecutively parallel, it is possible to perform the reflow treatment to the circuit substrate 1a without any stand-by time up to completion of the mounting treatment of the circuit substrate 1d and improve the production efficiency.

Next, when the mounting treatment of the circuit substrate 1d and the reflow treatment to the circuit substrate 1a are completed, the circuit substrate 1e retracted from the unwinding reel 11a is transported to the mounting zone 12 according to a predetermined transport tact as shown in FIG. 2(e), the circuit substrate 1d after the mounting treatment is transported to the reflow zone 13 and the circuit substrate 1a after the reflow treatment is taken up to a take-up reel 14a.

As a result, it is possible to complete the mounting and reflow treatments to the circuit substrate 1a by transporting the tape substrate 1 between the unwinding reel 11a and take-up reel 14a only once, perform the mounting and reflow treatments to other circuit substrates 1a to 1e at the same time and improve the production efficiency.

In the first embodiment of the present invention described above, the method of performing the cutting treatment separately from the mounting and reflow treatments is described. However, the mounting, reflow and cutting treatments can be simultaneously performed by installation of a cutting zone 15a between the reflow zone 13 and the unloader 14. At this time, if the circuit substrates 1a to 1e are drilled from the tape substrate 1, it is possible to transport the tape substrate 1 while the tape substrate 1 is taken up to the take-up reel 14a.

Figure 3:
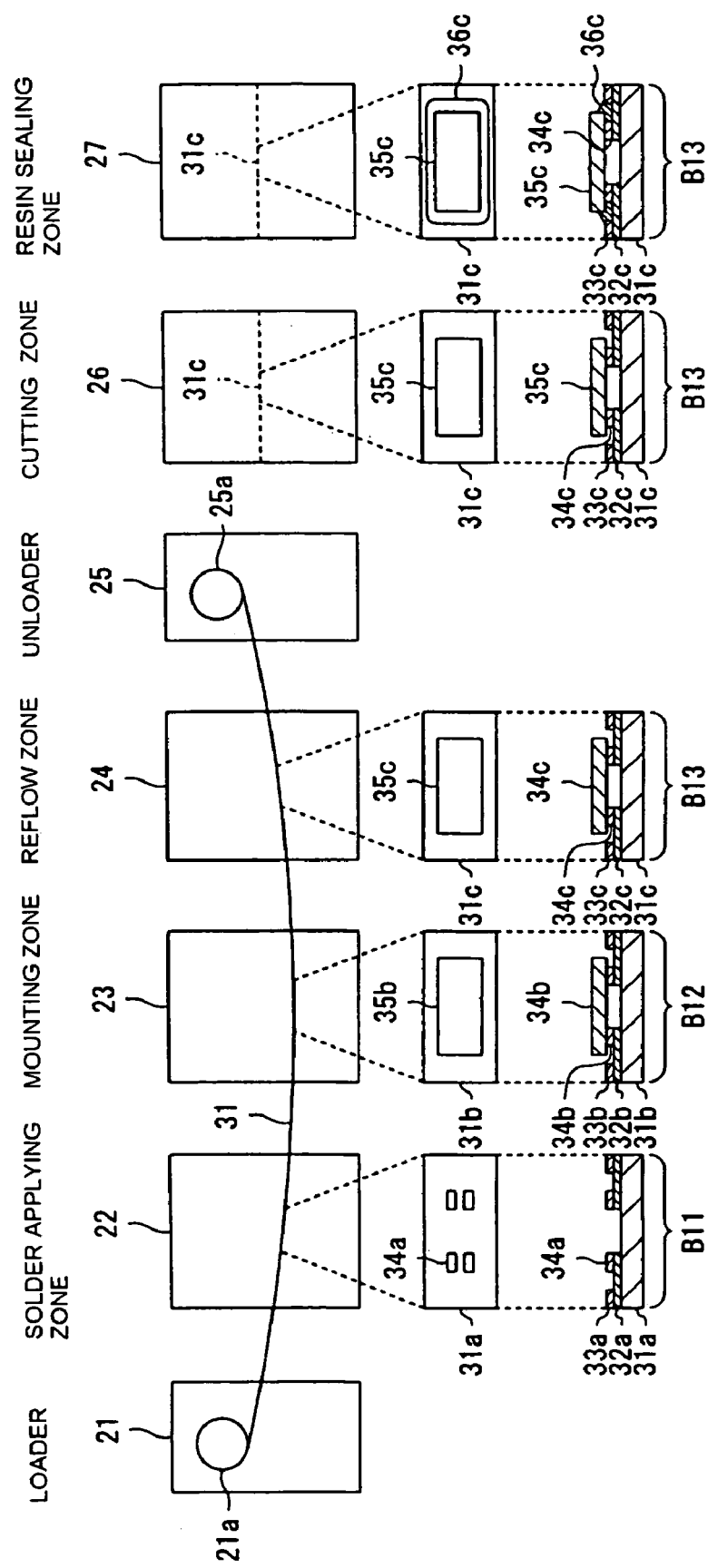
FIG. 3 illustrates a method of manufacturing an electronic device according to a second embodiment of the present invention.

FIG. 3 is a diagram for illustrating a method of manufacturing an electronic device according to a second embodiment of the present invention.

In FIG. 3, a solder applying zone 22, a mounting zone 23 and a reflow zone 24 are arranged consecutively in parallel between a loader 21 and an unloader 25 along the transport direction of a tape substrate 31.

On the other hand, an electronic component mounting area is provided at each of circuit blocks B11 to B13 in the tape substrate 31, and circuit substrates 31a to 31c are respectively provided in the circuit blocks B11 to B13. Furthermore, wirings 32a to 32c are respectively formed on the circuit substrates 31a to 31c, and insulating films 33a to 33c are formed on the wirings 32a to 32c by the exposure of the terminals thereof.

Moreover, the tape substrate 31 where a predetermined length of circuit substrates 31a to 31c are placed in line is hung between an unwinding reel 21a and a take-up reel 25a. A solder unapplied area of the tape substrate 31 is transported to a solder applying zone 22 provided between the loader 21 and unloader 25 at every transport tact of the tape substrate 31, the solder applying-finished area of the tape substrate 31 is transported to the mounting zone 23 arranged in parallel to the solder applying zone 22, and the mounting-finished area of the tape substrate 31 is transported to the reflow zone 24 arranged in parallel to the mounting zone 23.

Furthermore, a solder paste 34a is printed on the circuit substrate 31a in the solder applying zone 22, a semiconductor chip 35b is mounted on the circuit substrate 31b where the solder paste 34b is printed, and a semiconductor chip 35c is fixed on the circuit substrate 31c via a solder paste 34c in the reflow zone 24 by performing the reflow treatment to the circuit substrate 31c where the semiconductor chip 35c is mounted.

Moreover, when the solder applying, mounting and reflow treatments to all the circuit blocks B11 to B13 of the tape substrate 31 are completed, the tape substrate 31 is cut at each of the circuit blocks B11 to B13 in a cutting zone 26. Each of the cut circuit blocks B11 to B13 is transported to a resin sealing zone 27, for instance, the circuit block B13 can be resin-sealed by applying a sealing resin 36c around the semiconductor chip 35c.

As a result, it is possible to complete all the solder applying, mounting and reflow treatments to the circuit substrates 31a to 31c by transporting the tape substrate 31 between the unwinding and take-up reels 21a, 25a only once, and it also is possible to perform the solder applying, mounting and reflow treatments to other circuit substrates 31a to 31c at the same time and improve the production efficiency.

In addition, in the second embodiment of the present invention described above., a method of performing a cutting treatment separately from the solder applying, mounting and reflow processes is described. However, the solder applying, mounting and reflow and cutting treatments can be performed at one time by installing a cutting zone 26 between the reflow zone 24 and the unloader 25.

Figure 4:
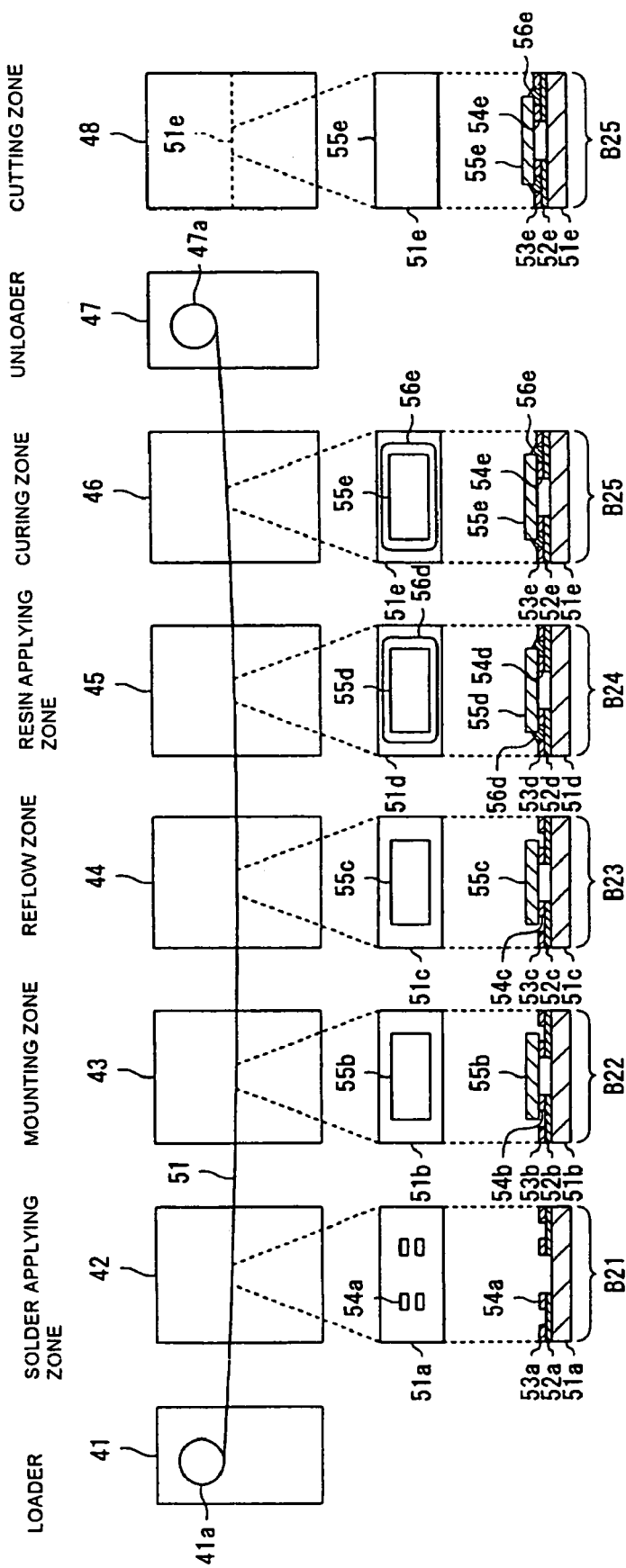
FIG. 4 illustrates a method of manufacturing an electronic device according to a third embodiment of the present invention.

FIG. 4 is a diagram for illustrating a method of manufacturing an electronic device according to a third embodiment of the present invention.

In FIG. 4, a solder applying zone 42, a mounting zone 43, a reflow zone 44, a resin applying zone 45 and a curing zone 4 are arranged between a loader 41 and an unloader 47 along the transport direction of a tape substrate 51.

An electronic component mounting area is provided at each of circuit blocks B21 to B25 in the tape substrate 51, and circuit substrates 51a to 51e are respectively provided on the circuit blocks B21 to B25. Furthermore, wirings 52a to 52e are respectively formed on the circuit substrates 51a to 51e, and insulating films 53a to 53e are formed on the wirings 52a to 52e by the exposure of the terminals thereof.

Moreover, the tape substrate 51 where a predetermined length of circuit substrates 51a to 51e are placed in line is hung between an unwinding reel 41a and a take-up reel 47a. A solder unapplied area of the tape substrate 51 is transported to a solder applying zone 42 provided between the unloader 41 and unloader 47 at every transport tact of the tape substrate 51, the solder applying-finished area of the tape substrate 51 is transported to the mounting zone 43 arranged in parallel to the solder applying zone 42, the mounting-finished area of the tape substrate 51 is transported to the reflow zone 44 arranged in parallel to the mounting zone 43, a reflow-finished area of the tape substrate 51 is transported to the resin applying zone 44 arranged in parallel to the reflow zone 44, and a resin applying-finished area of the tape substrate 51 is transported to a curing zone 46 arranged in parallel to the resin applying zone 45.

Furthermore, a solder paste 54a is printed on the circuit substrate 51a in the solder applying zone 42, a semiconductor chip 55b is mounted on the circuit substrate 51b where the solder paste 54b is printed in the mounting zone 43, a semiconductor chip 55c is fixed on the circuit substrate 51c via solder paste 54c in the reflow zone 44 by performing the reflow treatment to the circuit substrate 51c where the semiconductor chip 55c is mounted, and sealing resin 56d is applied around the semiconductor chip 55d fixed at the circuit substrate 51d in the resin applying zone 45, and sealing resin 56e on the circuit substrate 51e applied around the semiconductor chip 55e is hardened in a curing zone 46.

Moreover, when the solder applying, mounting, reflow, resin applying and curing treatments to all the circuit blocks B21 to B25 of the tape substrate 51 are completed, the tape substrate 51 is cut at each of the circuit blocks B21 to B25 in a cutting zone 48.

As a result, it is possible to complete all the solder applying, mounting, reflow, resin applying and curing treatments to the circuit substrates 51a to 51e by transporting the tape substrate 51 between the unwinding and take-up reels 41a, 47a only once, and it also is possible to perform the solder applying, mounting, reflow, resin applying and curing treatments on different circuit substrates 51a to 51e at the same time and improve the production efficiency.

In addition, in the third embodiment of the present invention described above, a method of performing a cutting treatment separately from the solder applying, mounting, reflow, resin applying and curing treatments is described. However, the solder applying, mounting, reflow, resin applying, curing and cutting treatments can be performed at one time by installing a cutting zone 48 between the curing zone 46 and the unloader 47.

Figure 5:
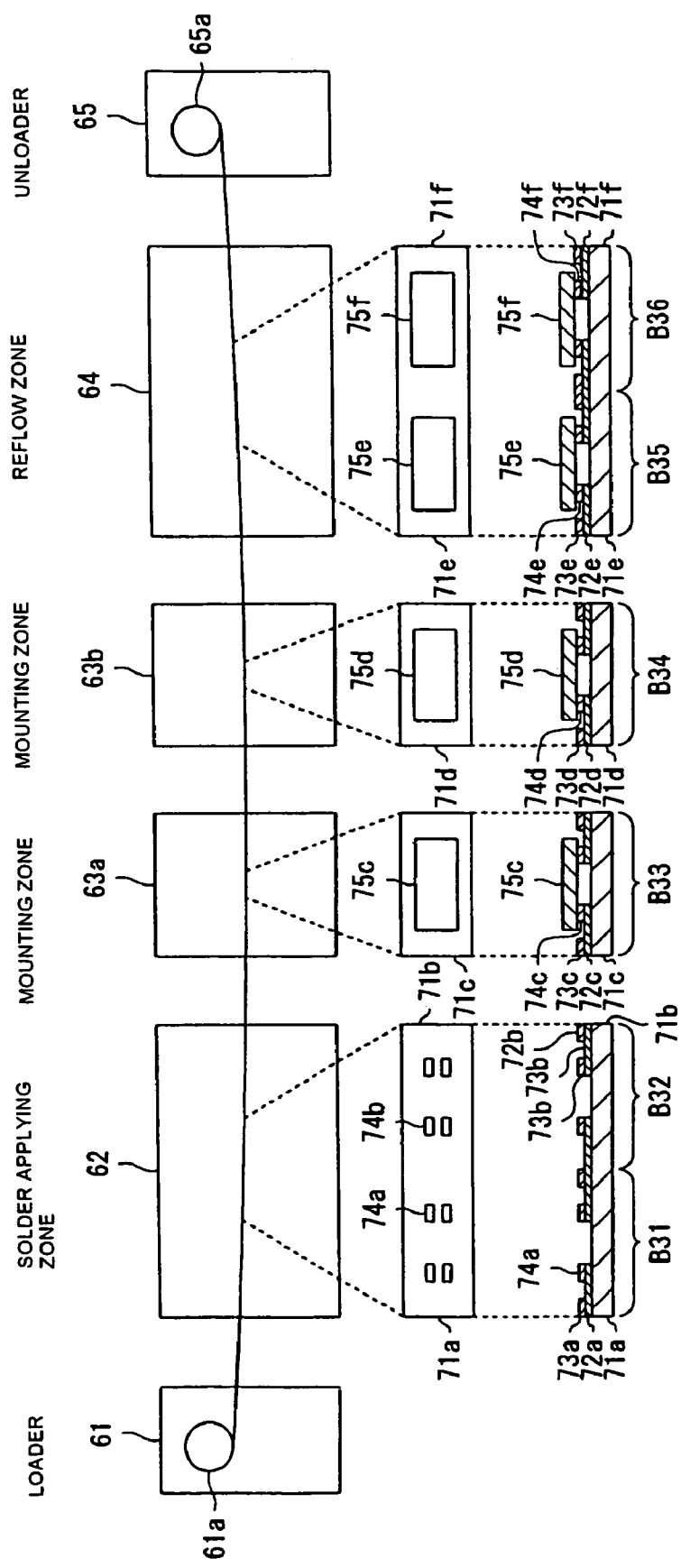
FIG. 5 illustrates a method of manufacturing an electronic device according to a fourth embodiment of the present invention.

FIG. 5 is a diagram for illustrating a method of manufacturing an electronic device according to a fourth embodiment of the present invention.

In FIG. 5, a solder applying zone 62, a mounting zones 63a, 63b and a reflow zone 64 are arranged in parallel between a loader 61 and an unloader 65 along the transport direction of a tape substrate 71. At this time, the mounting zones 63a, 63b can separately handle the solder applied area printed in the solder applying zone 62. For instance, the mounting zone 63a handles the first half of the solder applied area printed in the solder applying zone 62, and the mounting zone 63b handles the second half of the solder applied area printed in the solder applying zone 62.

On the other hand, an electronic component mounting area is provided at each of circuit blocks B31 to B36 in the tape substrate 71, and circuit substrates 71a to 71f are respectively provided in the circuit blocks B31 to B36. Furthermore, wirings 72a to 72f are respectively formed at the circuit substrates 71a to 71f, and insulating films 73a to 73f are formed on the wirings 72a to 72f by the exposure of the terminals thereof.

Moreover, the tape substrate 71 where a predetermined length of circuit substrates 71a to 71f are placed in a line is hung between an unwinding reel 61a and a take-up reel 65a. A solder unapplied area of the tape substrate 71 is transported to a solder applying zone 62 provided between the unloader 61 and unloader 65 at every transport tact of the tape substrate 71, the solder applying-finished area of the tape substrate 71 is transported to the mounting zones 63a, 63b arranged in parallel to the solder applying zone 62, and the mounting-finished area of the tape substrate 71 is transported to the reflow zone 64 arranged in parallel to the mounting zones 63a and 63b.

Furthermore, solder pastes 74a, 74b are printed on the circuit substrate 71a, 71 b at one time in the solder applying zone 62, a semiconductor chip 75c is mounted in the mounting zone 63a on the circuit substrate 71c where solder paste 74c is printed, a semiconductor chip 75d is mounted at the circuit substrate 71d where the solder paste 74d is printed in the mounting zone 63b, the semiconductor chips 75e, 75f are fixed at the circuit substrates 71e, 71f with the solder pastes 74e, 74f in the reflow zone 64 by performing the reflow treatment to the circuit substrates 71e, 71f where the semiconductor chips 75e, 75f are respectively mounted.

As a result, it is possible to restrict the enlargement of the mounting unit and reduce the mounting time even when there are a number of components to be mounted on each of the circuit blocks B31 to 36. Therefore, it is possible to match the time for the mounting treatment with the time for the solder applying and reflow treatments, reduce the stand-by time for the next treatment, even when the electronic component mounting and reflow treatments are performed in sequence, and improve the production efficiency.

Figure 6:
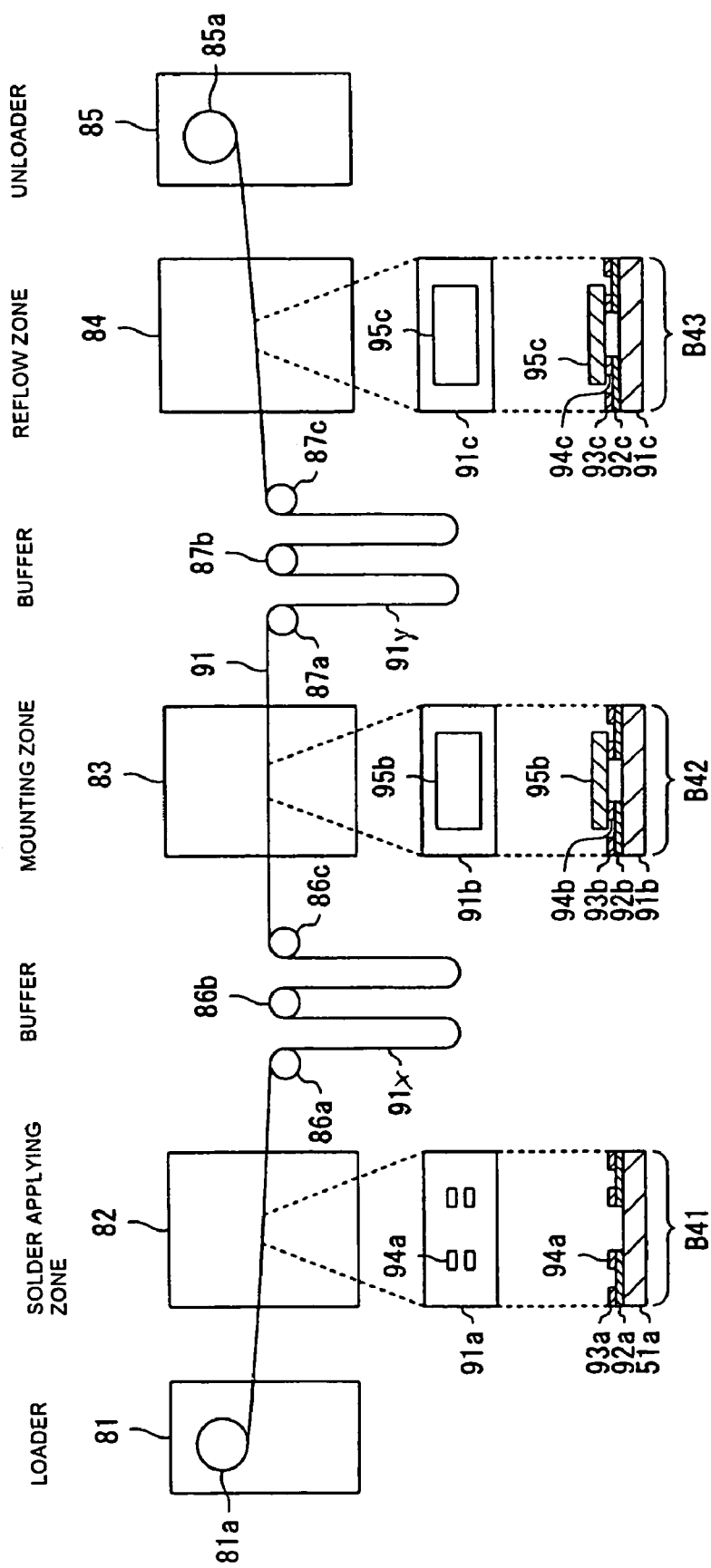
FIG. 6 illustrates a method of manufacturing an electronic device according to a fifth embodiment of the present invention.

FIG. 6 is a diagram for illustrating a method of manufacturing an electronic device according to a fifth embodiment of the present invention.

In FIG. 6, a solder applying zone 82, a mounting zone 83 and a reflow zone 84 are arranged in parallel between a loader 81 and an unloader 85 along the transport direction of a tape substrate 91. Also, roller groups 86a to 86c are provided between the solder applying zone 82 and the mounting zone 83 for collecting the tape substrate 91 at the front part of the mounting zone 83, and roller groups 87a to 87c are provided between the mounting zone 83 and the reflow zone 84 for collecting the tape substrate 91 at the front part of the reflow zone 84. In addition, the collected part 91x of the tape substrate 91 is supported by the roller groups 86a to 86c, and the collected part 91y of the tape substrate 91 is supported by the roller groups 87a to 87c.

An electronic component mounting area is provided at each of circuit blocks B41 to B43 in the tape substrate 91, and circuit substrates 91a to 91c are respectively provided in the circuit blocks B41 to B43. Furthermore, wirings 92a to 92c are respectively formed at the circuit substrates 91a to 91c, and insulating films 93a to 93c are formed on the wirings 92a to 92c by the exposure of the terminals thereof.

Moreover, the tape substrate 91 where a predetermined length of circuit substrates 91a to 91c are placed in line is hung between an unwinding reel 81a and a take-up reel 85a. A solder unapplied area of the tape substrate 91 is transported to a solder applying zone 82 provided between the loader 81 and unloader 85 at every transport tact of the tape substrate 91, the solder applying-finished area of the tape substrate 91 is transported to the mounting zone 83 arranged in parallel to the solder applying zone 82, and the mounting-finished area of the tape substrate 91 is transported to the reflow zone 84 arranged in parallel to the mounting zone 83.

Furthermore, a solder paste 94a is printed on the circuit substrate 91a in the solder applying zone 82, a semiconductor chip 95b is mounted in the mounting zone 83 on the circuit substrate 91b where solder paste 94b is printed, a semiconductor chip 95c is fixed on the circuit substrate 91c via the solder paste 94c in the reflow zone 84 by performing the reflow treatment to the circuit substrate 91c where the semiconductor chips 95c is mounted.

At this time, for instance, if trouble occurs in the mounting zone 83 which fails to perform the mounting treatment, the rotations of the rollers 86a, 87c are maintained but those of rollers 86c, 87a are stopped. As a result, it is possible to stop the transport process of the tape substrate 91 in the mounting zone 83 but maintain the transport process of the tape substrate 91 in the solder applying zone 82 and the reflow zone 84. Besides, it is possible to store the circuit substrate solder-printed in the solder applying zone 82 at the collected part 91x of the tape substrate 91 and perform the reflow treatment to the circuit substrate of the collected part 91y of the tape substrate 91 in the reflow zone 84.

Therefore, it is possible to continue to perform the reflow treatment even when trouble occurs in the mounting zone 83, and maintain the operational rate of the reflow zone 84, even when the mounting and reflow zones 83, 84 are arranged in parallel to the same tape substrate 91.

Besides, since the rotations of the rollers 86c and 87a to 87c are maintained but those of the unwinding reel 81a and roller 86a are stopped when trouble occurs in the solder applying zone 82, the transport process of the tape substrate 91 is stopped in the solder applying zone 82 but can be maintained in the mounting and reflow zones 83, 84.

In addition, the rotations of the rollers 86a to 86c and 87a are maintained but those of the roller 87c and take-up reel 85a are stopped when trouble occurs in the reflow zone 84, the transport process of the tape substrate 91 is stopped in the reflow zone 84 but can be maintained in the solder applying and mounting zones 82, 83.

In addition, a method of heating in the aforementioned reflow zones 13, 24, 44, 64 and 84 is not specifically restricted, for instance, to heating methods using hot air, a lamp, far infrared ray, laser heating or other contact heating methods can be utilized.

Figure 7:
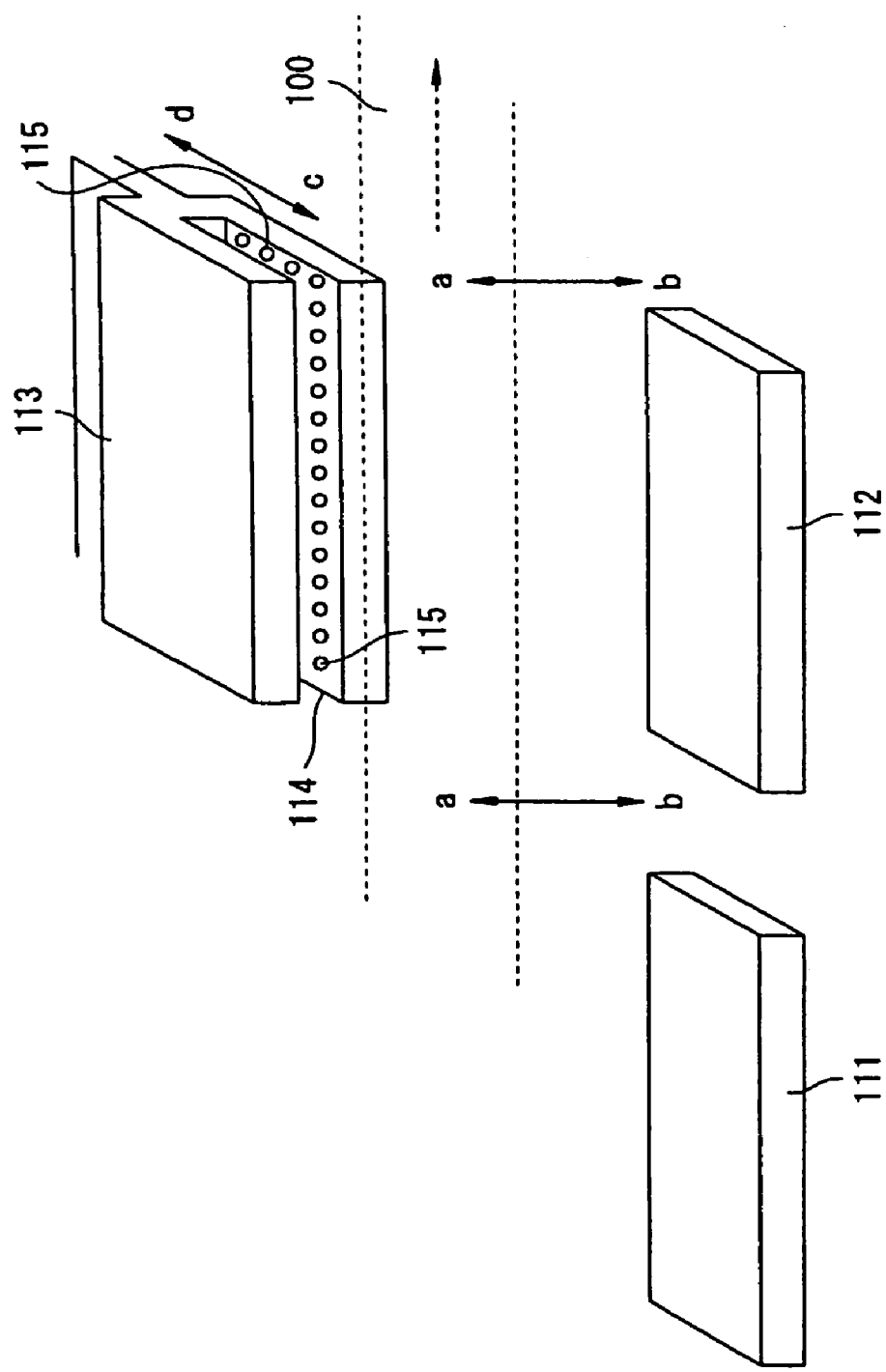
FIG. 7 illustrates an apparatus for manufacturing an electronic device according to a sixth embodiment of the present invention.

FIG. 7 is a perspective view for illustrating the schematic structure of an apparatus for manufacturing an electronic device according to a sixth embodiment of the present invention.

In FIG. 7, the apparatus comprises a preheating block 111 to give preheat, a main heating block 112 to give peak heat and a cooling block 113 to lower the temperature of the body to be heated to which peak heat is given. For instance, in the reflow process to be performed after the solder applying and mounting processes, heating or cooling treatment is performed to a tape substrate 100 as a continuous body having circuit substrates 101 placed in a line as a predetermined length of a body to be heated shown in FIG. 9.

At this time, for instance, the preheating block 111 is made up of metal or ceramic and freely moved in the directions of arrows a and b by a driving mechanism (not shown). The preheating block 111 is moved closer slowly to give preheat to the tape substrate 100, but the detailed description will be made below.

The main heating block 112 is made up of, for instance, metal or ceramic, and arranged close to the preheating block 111. Also, the main heating block 112 is freely moved in the direction of arrows a and b by a driving mechanism (not shown). The main heating block 112 can give peak-heat by contacting the tape substrate 100, but the detailed description will be made below.

The cooling block 113 is made up of metal or ceramic, and freely moved in the directions of arrows c and d by a driving mechanism (not shown). The cooling block 113 has a covering and sandwiching opening 114, the cross-section of which is U-shaped, for covering and sandwiching from the vertical direction of the thickness of the tape substrate 100 (top and bottom). A plurality of coolant blowout holes 115 are formed inside the covering and sandwiching opening 114. Air, oxygen, nitrogen, carbon dioxide, helium or fluorocarbon or the like can be used as a coolant.

Figure 9:
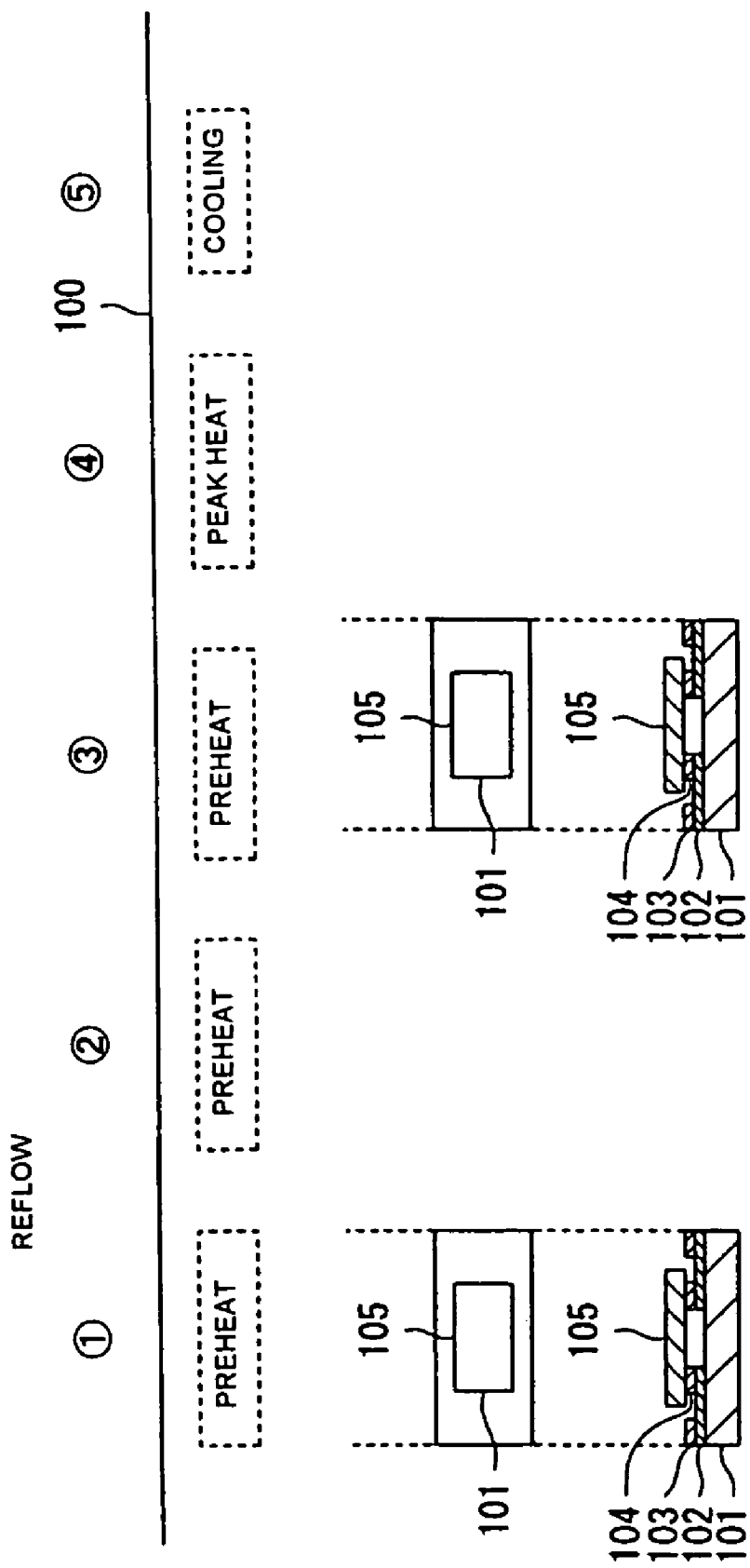
FIG. 9 illustrates a reflow treatment of FIG. 7.

At this time, the tape substrate 100 is made with a predetermined block length of lined-up circuit substrates 101 as shown in FIG. 9, the description of which will be made below. In the circuit substrate 101 shown in FIG. 9, a solder paste 104 is attached to a wiring 102 in the soldering process prior to the reflow process. Also, an adhesive like ACF is attached to the wiring 102 by transcription. Reference numeral 103 indicates an insulating film. The semiconductor chip 105 is mounted on the circuit substrate 101 via the soldering paste 104 in the mounting process after the soldering process.

Furthermore, for instance, when a production line from the loader 21 described in FIG. 3 through the unloader 25 is stopped by a certain cause, the preheating block 111 or main heating block 112 is separated from the tape substrate 100 during heat treatment by the preheating block 111 or the main heating block 112. Therefore, it is possible to avoid unnecessary overheating to the tape substrate 100.

Figure 8:
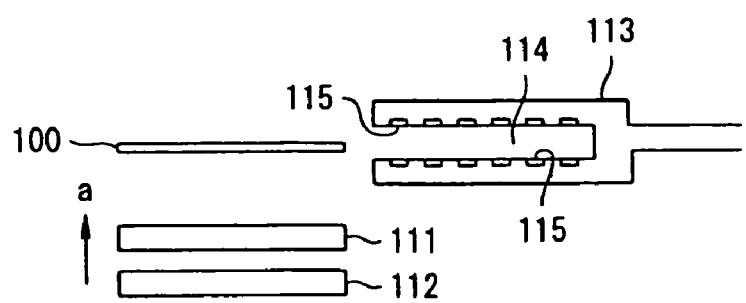
FIGS. 8(a)-(e) illustrate a reflow treatment of FIG. 7.
Figure 8:
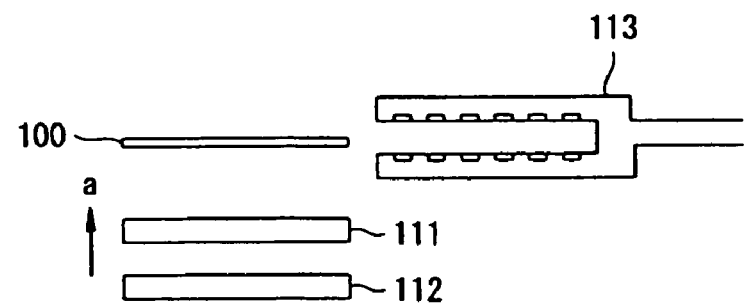
Figure 8:
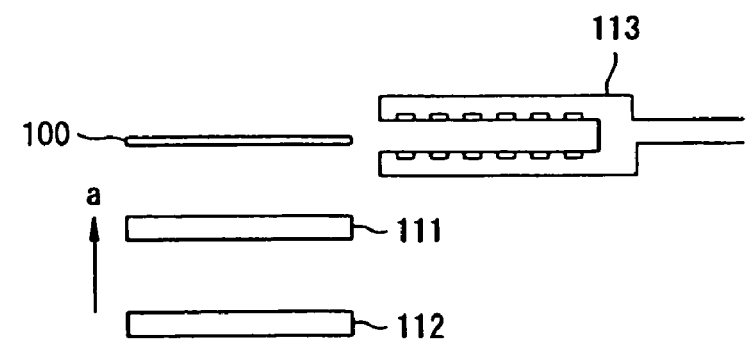
Figure 8:
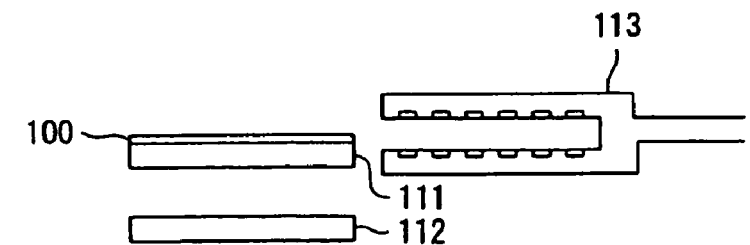
Figure 8:
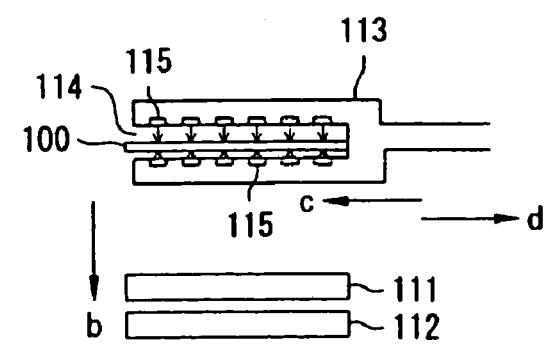

FIGS. 8 and 9 illustrate the reflow treatment of FIG. 7. FIG. 10 illustrates a temperature profile of the reflow treatment of FIG. 7.

In FIGS. 8 to 10, when the tape substrate 100 proceeds to the reflow process after completion of the soldering and mounting processes, the preheating block 111 rises in the direction of arrow a, one step higher, as shown in FIG. 8(a), and approaches the tape substrate 100. At this time, the main heating block 112 stands by at a predetermined position.

Further, the preheating block 111 gets closer to and performs the heating treatment to a predetermined block length of circuit substrates 101 of the tape substrate 100 shown in FIG. 9, for a predetermined period of time. As a result, a preheat (1) can be applied to the circuit substrates 101. The preheat (1) may have a temperature gradient as shown with the solid line in region (1) of FIG. 10.

When the heating treatment is completed in FIG. 8(a) by the preheating block 111, the preheating block 111 rises one step higher in the direction of arrow a as shown in FIG. 8(b), and approaches the tape substrate 100, and a heating treatment is performed to the circuit substrate 101 for a predetermined period of time similarly to the above. As a result, a preheat (2) can be applied to the circuit substrates 101 as shown in FIG. 9. The preheat (2) may have a temperature gradient as shown with the solid line in region (2) of FIG. 10.

When the heating treatment in FIG. 8(b) by the preheating block 111 is completed, the preheating block 111 rises one step higher in the direction of an arrow a as shown in FIG. 8(c) and approaches the tape substrate 100, and a heating treatment is performed to the circuit substrate 101 for a predetermined period of time similarly to the above. As a result, a preheat (3) can be applied to the circuit substrate 101 as shown in FIG. 9. The preheat (3) may have a temperature gradient as shown by the solid line in region (3) in FIG. 10. When the preheat (1) to (3) is applied to the circuit substrate 101 by the preheating block 111, the main heating block 112 stands by at a predetermined position, so as to avoid any thermal influence from the main heating block 112 to the circuit substrate 101.

When the heating in FIG. 8(c) by the preheating block 111 is completed, the preheating block 111 returns to its predetermined position as shown in FIG. 8(d). At this time, the tape substrate 100 is transported in the arrow direction of a dotted line shown in FIG. 7 by a predetermined block length of the circuit substrate 101. Then the main heating block 112 rises to get in contact with the tape substrate 100 and performs the heating treatment to the circuit substrate 101 for a predetermined period of time. As a result, a peak heat (4) can be applied to the circuit substrates 101 as shown in FIG. 9. The peak heat (4) may have a temperature gradient as shown by the solid line in region (4) in FIG. 10. Since the peak heat (4) is a melting point temperature+α, the solder paste 104 melts and the semiconductor chip 105 is bonded to the wiring 102 of the circuit substrate 101.

When the heating treatment in FIG. 8(d) by the main heating block 112 is completed, the main heating block 112 lowers in the direction of an arrow b and returns to a predetermined position as shown in FIG. 8(e). At the same time, the cooling block 113 moves in the direction of an arrow c from the predetermined position shown in FIG. 8(a) to get the tape substrate 100 vertically inserted and covered by the covering and sandwiching opening 114.

Then, a coolant is blown against from the top and bottom sides of the circuit substrate 101 through a plurality of coolant blowout holes 115 provided at the inner side of the covering and sandwiching opening 114 to thereby cool off the circuit substrate 101.

As a result, the circuit substrate 101 cools off as shown at (5) in FIG. 9. The cooling (5) may have a temperature gradient as shown by the solid line in region (5) in FIG. 10. As such, as the circuit substrate 101 cools off, the semiconductor chip 105 is fixed on the circuit substrate 101 with the wiring 102. After the cooling process is performed on the circuit substrate 101 for a predetermined period of time, the cooling block 113 moves in the direction of an arrow d from the state of FIG. 8(e) and returns to the predetermined position of the FIG. 8(a).

As described above, when preheat, peak heat and cooling are sequentially applied to a predetermined block length of the circuit substrate 101 of the tape substrate 100 and the reflow treatment is completed to a certain circuit substrate 101, the tape substrate 100 is transported by a predetermined block length of the circuit substrate 101, and, as shown in FIGS. 8(a) to (e), the preheat, peak heat and cooling sequentially perform the reflow treatment to the subsequent circuit substrate 101.

If a line between the loader 21 described in FIG. 3 through the unloader 25 is stopped by a certain cause, the preheating block 111 or main heating block 112 is separated from the tape substrate 100 if the heating treatment is being performed by the preheating block 111 or main heating block 112. Therefore, it is possible to avoid unnecessary extreme heating to the tape substrate 100.

On the other hand, when the stopped line is restored, the preheat, peak heat and cooling are applied again. At this time, for instance, if the temperature of the predetermined block length of the circuit substrate 101 of the tape substrate 100 lowers like in each of (1) to (4) shown by the dotted line of FIG. 10, the temperature of the preheating block 111 is slowly raised respectively according to (1) to (3) and that of the predetermined block length of the circuit substrate 101 of the tape substrate 100 is raised to a position shown in the solid line of FIG. 10. Next, the peak heat can be applied by contacting the main heating block 112 to the circuit substrate 101. Therefore, the reflow treatment can be subsequently performed without any damage to a product after the restoration of the line.

Like the above, in a sixth embodiment of the present invention described above, the preheating block 111 is slowly moved closer to the predetermined block length of the circuit substrate 101 of the tape substrate 100 from the predetermined position by rising movement for preheating and transported to the predetermined position. Then, the main heating block 112 arranged close to the preheating block 111 makes contact with the circuit substrate 101 to which preheat is given and which is transported at a predetermined tact for giving peak heat, and returns to the predetermined position. The cooling block 113 is moved closer to the circuit substrate 101 to which peak heat is given to cool off the circuit substrate 101 and returns to the predetermined position.

As a result, it is possible to distinctly maintain bordering temperatures between the preheating block 111 and main heating block 112, so as to readily perform quality control of a product. Advantageously, the light shielding structure in the conventional lamp heating method or far infrared ray heating method is no longer needed to thereby achieve a simplification of the apparatus structure.

Also, if a production line between the loader 21 described in FIG. 3 through the unloader 25 is stopped by a certain cause, the preheating block 111 or main heating block 112 is separated from the tape substrate 100 if the heating treatment is being performed by the preheating block 111 or main heating block 112. Therefore, it is possible to avoid an unnecessary extreme heating to the tape substrate 100 and readily carry out quality control of a product.

On the other hand, for instance, if the temperature of the predetermined block length of the circuit substrate 101 of the tape substrate 100 lowers like in each of (1) to (4) shown by the dotted line of FIG. 10 after the restoration of the stopped line, the temperature of the preheating block 111 is slowly raised respectively according to each of (1) to (3) and that of the predetermined block length of the circuit substrate 101 of the tape substrate 100 is raised to a position shown in the solid line of FIG. 10. Next, the peak heat can be applied again by contacting the main heating block 112 to the circuit substrate 101. Then, the cooling block 113 again cools the circuit substrate 101 to which the peak heat is applied. Therefore, the reflow can be subsequently performed without any damage to a product after the restoration of the line.

In addition, if the stopped line is restored, the preheat, peak heat and cooling are applied again. It is possible to significantly reduce the stand-by time of the heating or cooling after restoration.

Also, the circuit substrate 101 to which peak heat is given is cooled by a coolant from the plurality of coolant blowout holes 115 of the covering and sandwiching opening 114 of the cooling block 113, so as to reduce the cooling time by improving the cooling efficiency of the circuit substrate 101. Particularly, it is possible to readily prevent thermal oxidation even when the solder paste 104 is lead-free.

Even if a description is made only about a case that the preheating block 111 is raised step-by-step to apply the preheat in the present embodiment, the scope of the present invention is not limited to the aforementioned embodiment, and it is possible to apply the preheat by a linear increase of temperature.

In addition, in the present embodiment, a description is made about a case that the preheating block 111 and main heating block 112 are moved upwardly from the lower side of the tape substrate 100. However, the scope of the present invention is not limited to the aforementioned embodiment, and these components can also be moved downwardly from the top side of the tape substrate 100. In the present embodiment of the present invention, a covering and sandwiching opening 114 having a plurality of coolant blowout holes 115, the cross-section of which is U-shaped, is provided at the cooling block 113. However, the scope of the present invention is not limited to the aforementioned embodiment, and the cooling block 113 can be made in the shape of a flat plate and the coolant blowout holes 115 can be provided at a side facing the tape substrate 100. In the present embodiment, also, only one preheating block 111 is provided, but there may be a plurality of preheating blocks 111.

FIG. 11 is a perspective view for illustrating the schematic structure of an apparatus for manufacturing an electronic device according to a seventh embodiment of the present invention.

In FIG. 11, the apparatus comprises a heating block 211 for applying heat and a cooling block 213 for lowering the temperature of the body to be heated to which heat is given. For instance, in the reflow process to be performed after the soldering and mounting processes, heating or cooling treatment is performed to a tape substrate 200 as a continuous body where circuit substrates are placed in a line as a predetermined block length of the body to be heated. The same structure as that shown in FIG. 9 can be utilized as the circuit substrates placed in a line at the tape substrate 200, for instance.

The heating block 211 is made of, for instance, metal or ceramic, and can be freely moved in the direction of arrows a and b by a driving mechanism (not shown). The heating block 211 slowly approaches the tape substrate 200 for preheating, and makes contact with the tape substrate 200 for applying peak heat. The detailed description will be made below.

The cooling block 213 is made of, for instance, metal or ceramic, and can be freely moved in the direction of arrows c and d by a driving mechanism (not shown). The cooling block 213 includes a covering and sandwiching opening 214, the cross-section of which is U-shaped, for covering and sandwiching the tape substrate 200 from the vertical direction of its thickness. A plurality of coolant blowout holes 215 are provided at the inner side of the covering and sandwiching opening 214.

Figure 12:
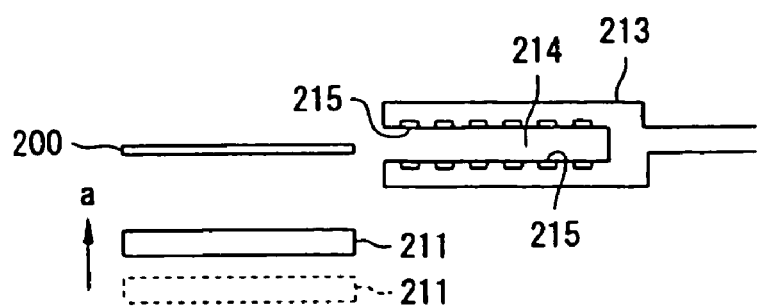
FIGS. 12(a)-(e) illustrate a reflow treatment of FIG. 11.
Figure 12:
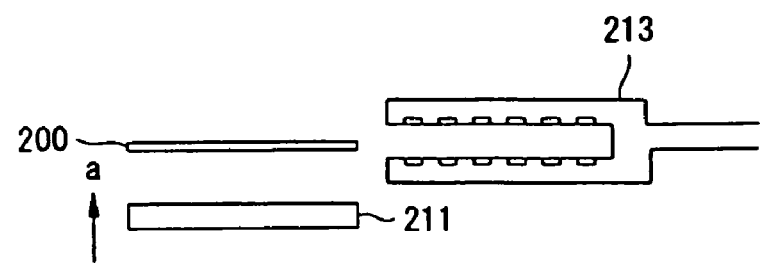
Figure 12:
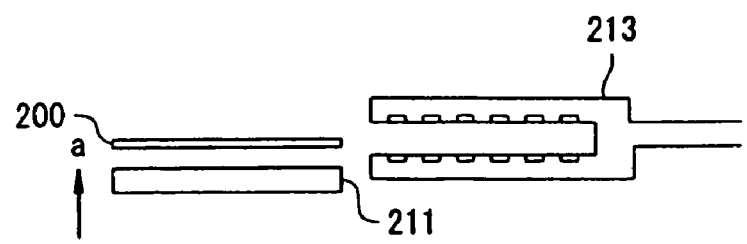
Figure 12:
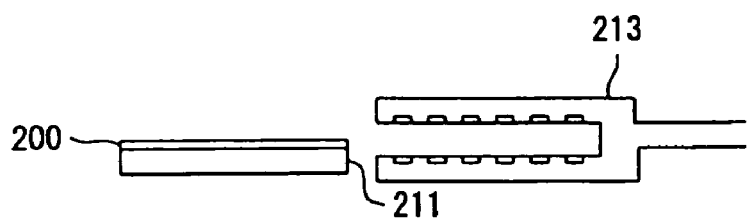
Figure 12:
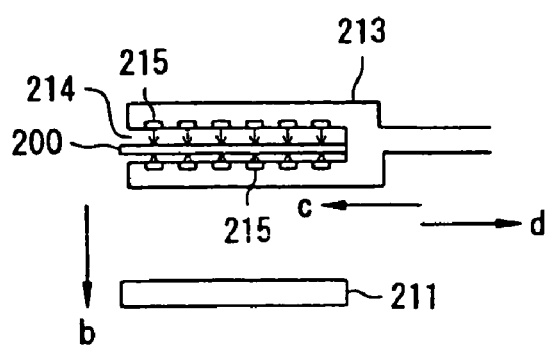

FIG. 12 is a side view for illustrating the reflow treatment of FIG. 11.

In FIG. 12, when the tape substrate 200 which has gone through the soldering and mounting processes proceeds to the reflow process, as shown in FIG. 12(a), the heating block 211 rises one step higher in the direction of an arrow a from an initial position shown in phantom and approaches the tape substrate 200. At this time, the heating block 211 approaches the tape substrate 200 and performs a heating treatment to the predetermined block length of the circuit substrate of the tape substrate 200 for a predetermined period of time. As a result, a preheat (1) similar to that of FIG. 9 is applied to the circuit substrate. The preheat (1) can be a temperature gradient as shown by the solid line in region (1) in FIG. 10.

When the heating treatment in FIG. 12(a) by the heating block 211 is completed, the heating block 211 rises one step higher in the direction of an arrow a as shown in FIG. 12(b) and approaches the tape substrate, and heating treatment is performed to the circuit substrate for a predetermined period of time, similar to the above. As a result, a preheat (2) similarly to that of FIG. 9 can be applied to the circuit substrate. The preheat (2) can be a temperature gradient as shown by the solid line in region (2) in FIG. 10.

When the heating treatment in FIG. 12(b) by the heating block 211 is completed, the heating block 211 rises one step higher in the direction of an arrow a as shown in FIG. 12(c) and approaches the tape substrate 200, and heating treatment is performed to the circuit substrate for a predetermined period of time, similarly to the above. As a result, a preheat (3) similar to that of FIG. 9 can be applied to the circuit substrate. The preheat (3) can be a temperature gradient as shown by the solid line in region (3) in FIG. 10.

When the heating treatment in FIG. 12(c) by the heating block 211 is completed, the heating block 211 rises one step higher in the direction of an arrow a as shown in FIG. 12(d) and approaches the tape substrate 200, and heating treatment is performed to the circuit substrate for a predetermined period of time, similarly to the above. As a result, a peak heat (4) similar to that of FIG. 9 can be applied to the circuit substrate. The peak heat (4) can be a temperature gradient as shown by the solid line in region (4) in FIG. 10.

At this time, since the peak heat (4) is a solder melting point temperature+α, a solder paste melts to bond the semiconductor chip with the wiring of the circuit substrate.

When the heating treatment in FIG. 12(d) by the heating block 211 is completed, the heating block 211 lowers in the direction of an arrow b as shown in FIG. 12(e) and returns to its original position. The cooling block 213 moves in the direction of an arrow c from an initial position shown in FIG. 12(a) to get the tape substrate 200 vertically inserted and covered by the covering and sandwiching opening 214.

A coolant is blown against from the top and bottom sides of the circuit substrate through a plurality of coolant blowout holes 215 provided at the inner side of the covering and sandwiching opening 214 to thereby cool off the circuit substrate.

As a result, the circuit substrate cools off as shown at (5) in FIG. 9. The cooling (5) can be a temperature gradient as shown by the solid line in region (5) in FIG. 10. As such, as the circuit substrate cools off, the semiconductor chip is fixed on the circuit substrate with the wiring. After the cooling process is performed on the circuit substrate for a predetermined period of time, the cooling block 213 moves in the direction of an arrow d from the state of FIG. 12(e) and returns to the initial position of FIG. 12(a).

As described above, when preheat, peak heat and cooling are sequentially applied to a predetermined block length of the circuit substrate of the tape substrate 200 and the reflow treatment is completed to a certain circuit substrate, the tape substrate 200 is transported by a predetermined block length of the circuit substrate, and, as shown in FIGS. 12(a) to (e), the preheat, peak heat and cooling sequentially perform the reflow treatment to the subsequent circuit substrate.

If a production line between the loader 21 described in FIG. 3 through the unloader 25 is stopped by a certain cause, the heating block 211 is separated from the tape substrate 200 if the heating treatment is being performed to the heating block 211. Therefore, it is possible to avoid an unnecessary extreme heating to the tape substrate 200.

On the other hand, if the stopped line is restored, the preheat, peak heat and cooling are applied again. At this time, for instance, if the temperature of the predetermined block length of the circuit substrate of the tape substrate 200 lowers like in each of (1) to (4) shown by the dotted line of FIG. 10, the temperature of the heating block 211 is slowly raised respectively according to each of (1) to (4) and that of the predetermined block length of the circuit substrate of the tape substrate 200 is raised to a position shown in the solid line of FIG. 5. Therefore, the reflow treatment can be subsequently performed without any damage to a product after the restoration of the line.

In the seventh embodiment of the present invention described above, the heating block 211 is slowly moved closer to the predetermined block length of the circuit substrate of the tape substrate 200 from an initial position by rising movement for preheating, it makes contact with the circuit substrate for giving peak heat and it is thereafter returned to the original position. Thereafter, the cooling block 213 is moved closer to the circuit substrate to which peak heat is given, from the initial position by horizontal movement, to cool off the circuit substrate and returns to the original position. Therefore, a plurality of heating zones as in the prior art are not required which thereby achieves a spatial reduction.

Also, the heating block 211 is slowly moved closer to the predetermined block length of the circuit substrate of the tape substrate 200 from the initial position by rising movement for preheating and it makes contact with the circuit substrate for giving peak heat. Furthermore, the tape substrate 200 is vertically inserted and covered by the covering and sandwiching opening 214 of the cooling block 213. A coolant is blown against from the top and bottom sides of the circuit substrate through a plurality of coolant blowout holes 215 provided at the inner side of the covering and sandwiching opening 214 to thereby cool off the circuit substrate. Therefore, it is possible to improve the heating or cooling efficiency of the circuit substrate, shorten the time taken for the heating or cooling treatment and achieve a reduction in energy consumption.

If a line between the loader 21 described in FIG. 3 through the unloader 25 is stopped by a certain cause, the heating block 211 is separated from the tape substrate 200. Therefore, it is possible to readily avoid an unnecessary extreme heating and any damage to the circuit substrate. In addition, when the stopped line is restored, the preheat, peak heat and cooling are applied again. Therefore, it is possible to significantly reduce the stand-by time of the heating or cooling treatment after restoration.

Also, the circuit substrate to which peak heat is given is cooled by a coolant from the plurality of coolant blowout holes 215 of the covering and sandwiching opening 214 of the cooling block 213, so as to improve the cooling efficiency of the circuit substrate, and reduce the time for the cooling treatment. Particularly, it is possible to readily prevent thermal oxidation even when the solder paste is lead-free.

In addition, in the present embodiment, a description is made about a case that the heating block 211 is raised for preheating and applying peak heat. However, the scope of the present invention is not limited to the aforementioned embodiment, and the heating block 211 may be placed in contact with the circuit substrate and the amount of heat applied may be slowly increased by the heating block 211 to apply the preheat and peak heat.

In the present embodiment, a description is made about a case that the heating block 211 is raised step-by-step for preheating. However, the scope of the present invention is not limited to the aforementioned embodiment, and it is possible to apply the preheat by a linear increase of the heating block 211.

In addition, in the present embodiment, a description is made about a case that the heating block 211 is moved upwardly from the lower side of the tape substrate 200. However, the scope of the present invention is not limited to the aforementioned embodiment, and it can also be moved downwardly from the top side of the tape substrate 200.

Moreover, in the present embodiment, a covering and sandwiching opening 214 having a plurality of coolant blowout holes 215, the cross-section of which is U-shaped, is provided at the cooling block 213. However, the scope of the present invention is not limited to the aforementioned embodiment, the cooling block 213 can be made in the shape of a flat plate and the coolant blowout holes 215 can be provided at a side facing the tape substrate 200.

Figure 14:
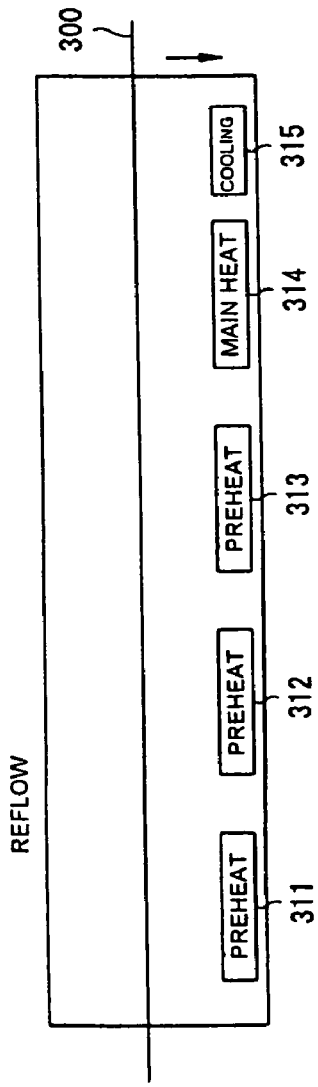
FIGS. 14(a)-(c) illustrate a method of manufacturing an electronic device according to the eighth embodiment of the present invention.
Figure 14:
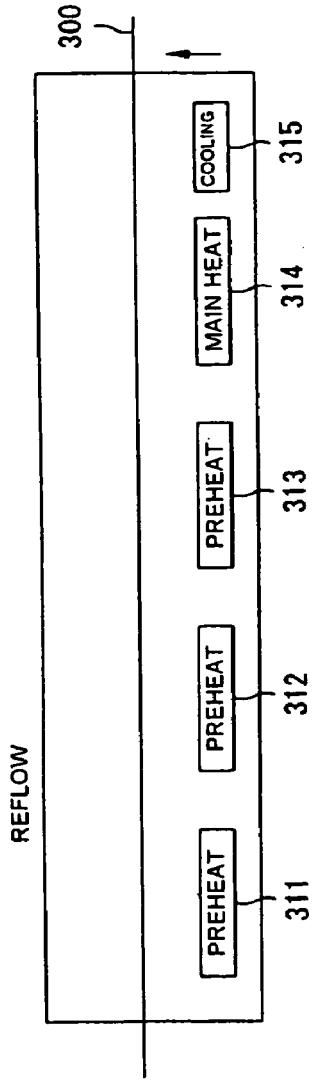
Figure 14:
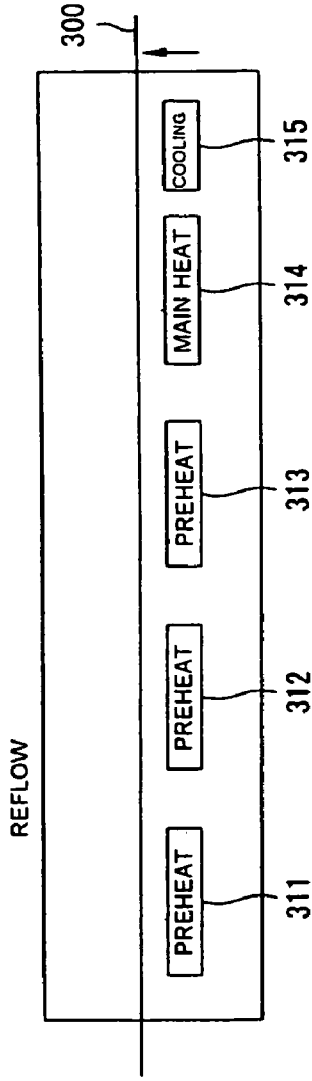

FIGS. 13 and 14 illustrate a method of manufacturing an electronic device according to an eighth embodiment of the present invention.

In FIG. 13, an apparatus comprises preheating blocks 311 to 313 for applying preheat, a main heating block 314 for applying peak heat and a cooling block 315 for lowering the temperature of the body to be heated to which peak heat is applied. In the reflow process to be performed after the soldering and mounting processes, heating or cooling is performed to a tape substrate 300 as a continuous body where circuit substrates 301 are placed in a line as a predetermined block length of the body to be heated.

These preheating blocks 311 to 313, the main heating block 314 and cooling block 315 are made of, for instance, metal or ceramic, and a gap of 2 mm or so can be provided between the preheating blocks 311 to 313 and the main heating block 314. The gap can avoid the direct thermal transfer between the preheating blocks 311 to 313 and the main heating block 314 and all can make free movements individually, which will be explained later.

The preheating blocks 311 to 313, main heating block 314 and cooling block 315 can make vertical movements. When the heating or cooling treatment is performed to the tape substrate 300, the preheating blocks 311 to 313, main heating block 314 and cooling block 315 are moved upwardly and contact the predetermined block length of the circuit substrate 301 of the tape substrate 300, as shown in FIG. 13(b). The vertical movements of the preheating blocks 311 to 313, main heating block 314 and cooling block 315 can be made simultaneously or separately. Furthermore, instead of the vertical movements of the preheating blocks 311 to 313, main heating block 314 and cooling block 315, the tape substrate 300 can be vertically moved.

At this time, a solder paste 304 is attached to a wiring 302 of the circuit substrate 301 in the soldering process prior to the reflow process. Also, an adhesive like ACF is attached to the wiring 302 by transcription. Reference numeral 303 indicates an insulating film. The semiconductor chip 305 is mounted on the circuit substrate 301 via the soldering paste 303 in the mounting process after the soldering process.

When the preheating blocks 311 to 313, main heating block 314 and cooling block 315 are in contact with the predetermined block length of the circuit substrate 301 of the tape substrate 300 for a predetermined period of time to complete a heating or cooling treatment, they move downwardly to be separated from the tape substrate 300. The vertical movements of the preheating blocks 311 to 313, main heating block 314 and cooling block 315 and the transport process of the tape substrate 300 in the direction of an arrow can make it possible to perform a sequential processes of preheating, applying peak heat and cooling to the circuit substrate 301. At this time, the preheat (1) to (3) shown in FIG. 10 is applied to the tape substrate 300 by the preheating blocks 311 to 313. The main heating block 314 is made to apply to the tape substrate 300 the peak heat of the solder melting point temperature+$\alpha$ as shown in (4) of FIG. 10. The cooling block 315 is made to lower the temperature of the tape substrate 300 as shown in (5) of FIG. 10.

Next, a description will be made about a method of manufacturing an electronic device thus constructed.

In FIG. 13(a), if the circuit substrate 301 of the tape substrate 300 that has gone through the soldering and mounting processes proceeds to the reflow process, it is transported to the preheating blocks 311 to 313, main heating block 314 and cooling block 315.

Then, when the circuit substrate 301 of the tape substrate 300 is transported to the preheating blocks 311 to 313, main heating block 314 and cooling block 315 after completion of the soldering and mounting processes, the preheating blocks 311 to 313, main heating block 314 and cooling block 315 move upwardly to contact the tape substrate 300. At this time, first of all, the preheating block 311 is in contact with the predetermined block length of the circuit substrate 301 of the tape substrate 300 for a predetermined period of time, to thereby perform the preheating treatment. As a result, the preheat shown with the solid line in region (1) of FIG. 10 is applied to the circuit substrate 301.

At this time, when the heating treatment is performed by causing the preheating block 311 to make contact with the circuit substrate 301 for a predetermined period of time, the preheating blocks 312 to 313, main heating block 314 and cooling block 315 are in contact with the circuit substrate 301 at the downstream side of the tape substrate 300, and the preheat, peak heat and cooling shown with the sold lines in regions (2) to (5) of FIG. 10 are given to the circuit substrate 301 at the downstream side of the tape substrate 300. As a result, the preheat, peak heat and cooling treatments can be performed at one time to a plurality of circuit substrates 301 placed in a line on the tape substrate 300 by the preheating blocks 311 to 313, main heating block 314 and cooling block 315, thereby improving the production efficiency.

When the heating treatment by the preheating block 311 for a predetermined period of time is completed, the preheating blocks 311 to 313, main heating block 314 and cooling block 315 are separated away from the tape substrate 300. Then, the tape substrate 300 is transported in the direction of an arrow in FIG. 13(a). At this time, the transport stroke is matched with the predetermined block length of the circuit substrate 301 of the tape substrate 300. The circuit substrate 301 that has gone through the heating treatment with the preheating block 311 gets to the position of the preheating block 312, the tape substrate 300 stops being transported in the direction of an arrow in FIG. 13(a), and the preheating blocks 311 to 313, main heating block 314 and cooling block 315 rise again. At this time, the preheating block 312 makes contact with the predetermined block length of the circuit substrate 301 of the tape substrate 300 for a predetermined period of time to perform heating treatment. As a result, the preheat shown in region (2) of FIG. 10 is given to the circuit substrate 301.

At this time, when the heating treatment is performed by causing the preheating block 312 to make contact with the circuit substrate 301 for a predetermined period of time, the preheating block 311 is in contact with the circuit substrate 301 at the upstream side of the tape substrate 300 to thereby apply the preheat shown with the solid line in region (1) of FIG. 10 to the circuit substrate 301 at the upstream side of the tape substrate 300. Meanwhile, the preheating block 313, main heating block 314 and cooling block 315 are in contact with the circuit substrate 301 at the downstream side of the tape substrate 300 to thereby apply the preheat, peak heat and cooling respectively shown with solid lines of regions (3) to (5) of FIG. 10, to the circuit substrate 301 at the downstream side of the tape substrate 300.

When the heating treatment by the preheating block 312 for a predetermined period of time is completed, the preheating blocks 311 to 313, main heating block 314 and cooling block 315 are separated from the tape substrate 300. Then, the tape substrate 300 is transported in the direction of an arrow in FIG. 13(a). The circuit substrate 301 that has gone through the heating treatment with the preheating block 312 gets to the position of the preheating block 313, the tape substrate 300 stops being transported in the direction of an arrow in FIG. 13(a), and the preheating blocks 311 to 313, main heating block 314 and cooling block 315 rise again. At this time, the preheating block 313 makes contact with the predetermined block length of the circuit substrate 301 of the tape substrate 300 for a predetermined period of time to perform heating treatment. As a result, the preheat shown with the solid line in region (3) of FIG. 10 is given to the circuit substrate 301.

At this time, when the heating treatment is performed by causing the preheating block 313 to make contact with the circuit substrate 301 for a predetermined period of time, the preheating blocks 311, 312 are in contact with the circuit substrate 301 at the upstream side of the tape substrate 300 to thereby apply the preheat shown with solid lines of regions (1) and (2) of FIG. 10, to the circuit substrate 301 at the upstream side of the tape substrate 300. Meanwhile, the main heating block 314 and cooling block 315 are in contact with the circuit substrate 301 at the downstream side of the tape substrate 300 to thereby apply the peak heat and cooling respectively shown with solid lines of regions (4) and (5) of FIG. 10, to the circuit substrate 301 at the downstream side of the tape substrate 300.

When the heating treatment by the preheating block 313 for a predetermined period of time is completed, the preheating blocks 311 to 313, main heating block 314 and cooling block 315 are separated from the tape substrate 300. Then, the tape substrate 300 is transported in the direction of an arrow in FIG. 13(a). When the circuit substrate 301 that has gone through the heating treatment with the preheating block 313 gets to the position of the main heating block 314, the tape substrate 300 stops being transported in the direction of an arrow in FIG. 13(a), and the preheating blocks 311 to 313, main heating block 314 and cooling block 315 rise again. At this time, the main heating block 314 makes contact with the predetermined block length of the circuit substrate 301 of the tape substrate 300 for a predetermined period of time to perform heating treatment. As a result, the peak heat shown in region (4) of FIG. 10 is given to the circuit substrate 301, so that the solder paste 304 melts to bond semiconductor chip 305 to the wiring 302 on the circuit substrate 301.

At this time, when the heating treatment is performed by causing the main heating block 314 to make contact with the circuit substrate 301 for a predetermined period of time, the preheating blocks 311 to 313 are in contact with the circuit substrate 301 at the upstream side of the tape substrate 300 to thereby apply the preheat shown with solid lines of regions (1) to (3) of FIG. 10 to the circuit substrate 301 at the upstream side of the tape substrate 300. Meanwhile, the cooling block 315 is in contact with the circuit substrate 301 at the downstream side of the tape substrate 300 to thereby apply the cooling shown in the solid line in region (5) of FIG. 10 to the circuit substrate 301 at the downstream side of the tape substrate 300.

When the heating treatment by the main heating block 314 for a predetermined period of time is completed, the preheating blocks 311 to 313, main heating block 314 and cooling block 315 are separated from the tape substrate 300. Then, the tape substrate 300 is transported in the direction of an arrow in FIG. 13(a). When the circuit substrate 301 that has gone through the heating treatment with the main heating block 314 gets to the position of the cooling block 315, the tape substrate 300 stops being transported in the direction of an arrow in FIG. 13(a), and the preheating blocks 311 to 313, main heating block 314 and cooling block 315 rise again. At this time, the cooling block 315 makes contact with the predetermined block length of the circuit substrate 301 of the tape substrate 300 for a predetermined period of time to perform cooling treatment. As a result, in the circuit substrate 301, the temperature as shown in regions (5) of FIG. 10 lowers, so that the semiconductor chip 305 is fixed to the circuit substrate 301 via the wiring 302.

At this time, when the temperature lowering treatment is performed by causing the cooling block 315 to make contact with the circuit substrate 301 for a predetermined period of time, the preheating blocks 311 to 313 and main heating block 314 are in contact with the circuit substrate 301 at the upstream side of the tape substrate 300 to thereby apply the preheat and peak heat shown with solid lines of regions (1) to (4) of FIG. 10, to the circuit substrate 301 at the upstream side of the tape substrate 300.

As described above, when preheat, peak heat and cooling are sequentially applied to a predetermined block length of the circuit substrate 301 of the tape substrate 300 by being transported in the direction of an arrow of FIG. 13(a) of the tape substrate 300. Thus, the reflow process for the circuit substrate 301 is completed.

If a production line between the loader 21 described in FIG. 3 through the unloader 25 is stopped by a certain cause, the preheating blocks 311 to 313, main heating block 314 and cooling block 315 are separated from the tape substrate 300, to a position where the temperature of the tape substrate 300 is kept at a temperature not to affect the product quality. Therefore, it is possible to avoid an unnecessary extreme heating to the tape substrate 300.

On the other hand, when the stopped line is restored, the preheat, peak heat and cooling are applied again. At this time, for instance, if the temperature of the predetermined block length of the circuit substrate 301 of the tape substrate 300 lowers like as shown with the dotted line of FIG. 10, the temperature of the predetermined block length of the circuit substrate 301 of the tape substrate 300 can be slowly raised up to the position shown with the solid line of FIG. 10 by slowly raising the preheating blocks 311 to 313, main heating block 314 and cooling block 315. Therefore, the reflow treatment can be subsequently performed without any damage to a product after the restoration of the stopped line. In addition, instead of slowly raising the preheating blocks 311 to 313, main heating block 314 and cooling block 315, the circuit substrate 301 can be slowly lowered.

In case of restoration of the stopped line, first of all, only preheating blocks 311 to 313 are raised to apply a predetermined level of preheat to the circuit substrate 301, and then peak heat is given to the circuit substrate 301 to which preheat was given by raising the main heating block 314. At this time, by returning the circuit substrate 301 placed on the main heating block 314 to the preheating block 313, for instance, a predetermined level of preheat can be given to the circuit substrate 301 even when peak heat is being given by the main heating block 314.

In the eighth embodiment described above, the preheat of (1) to (3) is given as the preheating blocks 311 to 313 are in contact with the predetermined block length of the circuit substrate 301 of the tape substrate 300, the peak heat of (4) is given as the main heating block 314 is in contact with the circuit substrate 301 having the preheat of (3), and the cooling is given to lower the temperature of the circuit substrate 301 as the cooling block 315 is in contact with the circuit substrate 301 having the peak heat.

Likewise, if the heating or cooling treatment to the tape substrate 300 is performed by contacting with the preheating blocks 311 to 313, main heating block 314 and cooling block 315, there is an improvement in the heating or cooling efficiency to the tape substrate 300, and a reduction in the time taken for the heating or cooling treatment. Thus, it is possible to improve productivity. In addition, neither a hot air circulating mechanism as in the conventional hot air circulating method, nor a light shielding structure of the type for performing local heating as in the conventional lamp heating method or in the far infrared ray method is needed. As such, there are advantages in the present invention in that there is no enlargement of the apparatus for manufacturing an electronic device, that the heating or cooling using the preheating blocks 311 to 313, main heating block 314 and cooling block 315 can be performed separately to thereby readily respond to the treatment time matched with the block length and that the borderline temperature between the preheating blocks 311 to 313 is distinctly maintained, because there is no heat transfer therebetween, thereby easily maintaining quality control of the product.

If a line between the loader 21 described in FIG. 3 through the unloader 25 is stopped by a certain cause, the preheating blocks 311 to 313, main heating block 314, cooling block 315 are separated from the tape substrate 300. Therefore, it is possible to avoid an unnecessary extreme heating to the tape substrate 300 and damage to a product. Furthermore, if the stopped line is restored, the preheat, peak heat and cooling are given again to thereby significantly shorten the stand-by time of the heating or cooling treatment after restoration.

Moreover, the cooling block 315 is in contact with the circuit substrate 301 to which peak heat is given for cooling the circuit substrate 301, so as to improve the cooling efficiency of the circuit substrate 301, shorten cooling time, and particularly prevent thermal oxidation even when the solder paste 224 is lead-free.

In the eighth embodiment, there are three preheating blocks 311 to 313. However, the scope of the present invention is not limited thereto, and there may be more or less preheating blocks. If there is one preheating block, the preheat shown in (1) to (3) of FIG. 10 can be slowly given by causing the preheating block to slowly approach the tape substrate 300. Moreover, the vertical movements of the preheating blocks 311 to 313, main heating block 314 and cooling block 315 can be made simultaneously or individually. The preheating blocks 311 to 313 and the main heating block 314 can be combined into one. In this case, the preheat shown with solid lines in regions (1) to (3) of FIG. 10 and peak heat shown with the solid line in region (4) of FIG. 10 can be given by slowly causing one heating block to approach or make contact with the tape substrate 300.

In addition, in the eighth embodiment, in the reflow process, the preheating blocks 311 to 313, main heating block 314 and cooling block 315 are vertically moved in the reflow process when the tape substrate 300 is matched with a predetermined block length of the circuit substrate 301 for transport. However, it is not limited thereto, and the preheating blocks 311 to 313, and main heating block 314 and cooling block 315 may be raised and kept in contact with the tape substrate 300 for transport of the tape substrate 300.

In the cooling block 315 a hollow pipe can be provided for performing cooling while gas or liquid flows through the hollow pipe. As a result, it is possible to forcibly cool the cooling block 315 without a change in the external shape of the cooling block 315 and improve the cooling efficiency. The gas flowing through the pipe provided in the cooling block 315 can be, for instance, air, oxygen, nitrogen carbon dioxide, helium or fluorocarbon, while the liquid flowing through the pipe can be, for instance, water or oil. In addition, the internal side of the pipe provided in the cooling block 315 can be low in pressure, which may further improve cooling efficiency.

Figure 15:
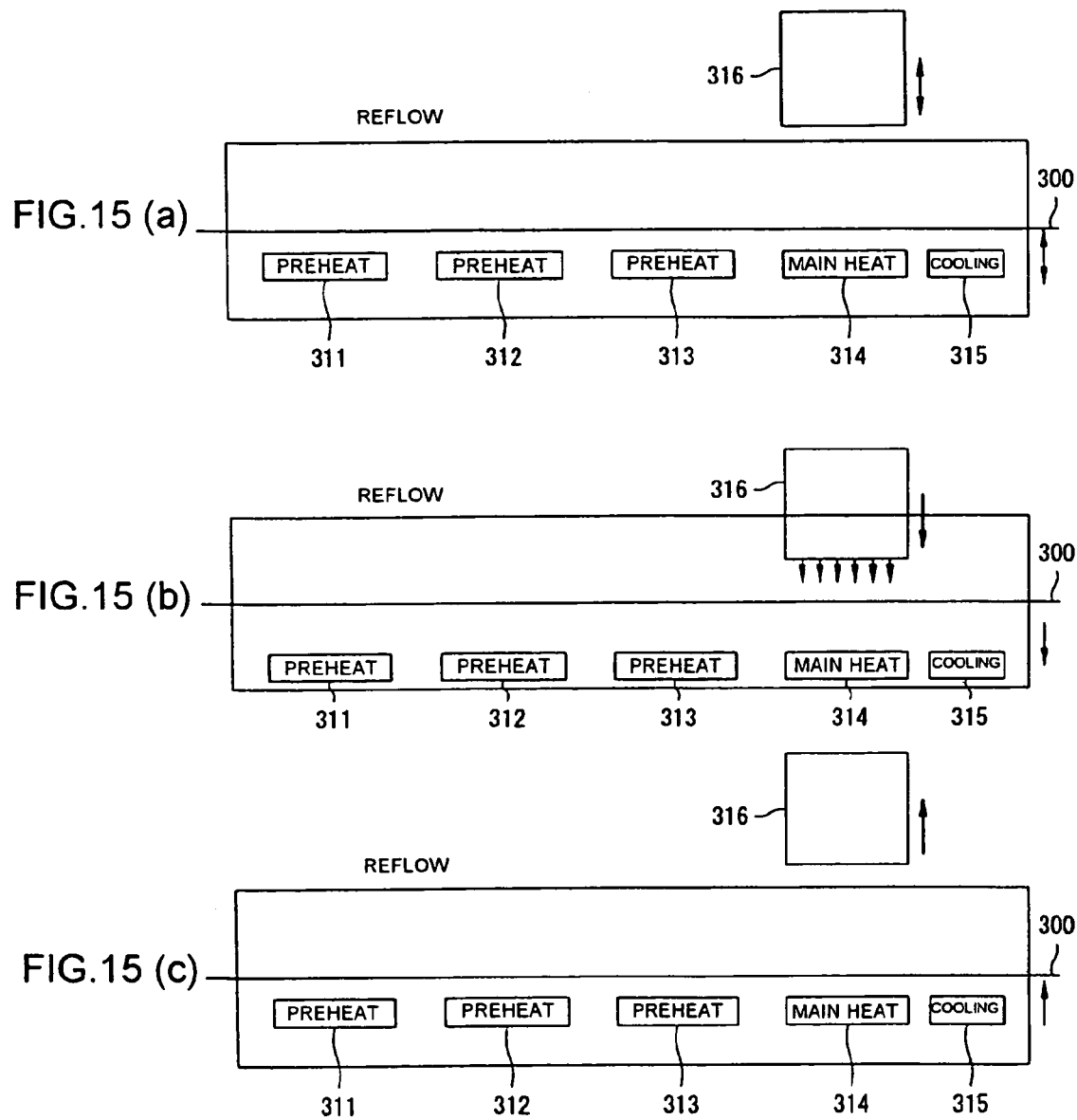
FIGS. 15(a)-(c) illustrate a method of manufacturing an electronic device according to a ninth embodiment of the present invention.

FIG. 15 illustrates a method of manufacturing an electronic device according to a ninth embodiment of the present invention.

In FIG. 15(a), in addition to the structure shown in FIG. 13, a hot air blow block 316 that helps provision of preheat is provided. The hot air blow block 316 is positioned over the heating block 315 for making vertical movements by a driving mechanism (not shown). When the stopped line is restored, the hot air blow block 316 moves down close to the tape substrate 300 to provide a predetermined level of preheat to the circuit substrate 301 over the main heating block 315.

Hereinafter, a description will be made about a method of manufacturing an electronic device thus constructed.

First of all, when the reflow process is performed to the circuit substrate 301 of the tape substrate 300 to which the soldering and mounting process are completed, the preheating block 311 to 313, main heating block 314 and cooling block 315 are respectively moved upwardly and contact the tape substrate 300, as shown in FIG. 13, to perform the reflow treatment.

At this time, as described above, if a certain cause stops the line between the loader 21 described in FIG. 3 through the unloader 25, the preheating block 311 to 313, main heating block 314 and cooling block 315 are separated from the tape substrate 300 by a driving mechanism (not shown) to a position where a certain level of temperature is kept without influencing the tape substrate 300 as shown in FIG. 15(b). At this time, the hot air blow block 316 is dropped down by a driving mechanism (not shown) from the top part of the main heating block 314 to get close to the tape substrate 300.

When the stopped line is restored, hot air is supplied from the hot air blow block 316 to the circuit substrate 301. At this time, if the temperature of the circuit substrate 301 over the main heating block 314 gets lower as shown by the dotted line in region (4) of FIG. 10, preheat up to the solid line in region (3) of FIG. 10 is provided to the circuit substrate 301.

When preheat is supplied to the circuit substrate 301 over the main heating block 314, the hot air blow block 316 is moved up by the driving mechanism (not shown) and separated from the tape substrate 300 as shown in FIG. 15(c). On the other hand, the preheating blocks 311 to 313, main heating block 314 and cooling block 315 are moved up and contact the tape substrate 300. Then, the aforementioned general heating and cooling treatment are subsequently performed. Therefore, it is possible to perform the reflow treatment without any damage to the product after restoration of the line.

Likewise, in the ninth embodiment described above, if a certain cause stops the line between the loader 21 described in FIG. 3 through the unloader 25, the preheating block 311 to 313, main heating block 314 and cooling block 315 are separated from the tape substrate 300 by a driving mechanism (not shown) to a position where a certain level of temperature is kept without making any influence on the tape substrate 300. At this time, the hot air blow block 316 is dropped down by a driving mechanism (not shown) from the top of the main heating block 314 to get close to the tape substrate 300. When the stopped line is restored, the preheat is supplied by hot air blown by the hot air blow block 316 to the circuit substrate 301, it is possible to surely avoid any damage to a product when the line is stopped, shorten the stand-by time for general operations to be made after restoration and further avoid undesirable thermal influence made by the main heating block 314 to the circuit substrate 301 to which the preheat is supplied.

Although a description is made about the ninth embodiment where the preheating blocks 311 to 313, main heating block 314 and cooling block 315 are moved up from the lower side of the tape substrate 300, the scope of the present invention is not to be limited thereto, and they can also be dropped down from the top side of the tape substrate 300. In this case, the hot air blow block 316 is moved up from the lower side of the tape substrate 300.

FIG. 16 illustrates a method of manufacturing an electronic device according to a tenth embodiment of the present invention.

FIG. 16(a) includes a preheating block 412 for supplying preheat, a main heating block 413 for supplying peak heat, and a cooling block 414 provided for lowering the temperature of a body to be heated to which peak heat is supplied. Besides, a cooling block 411 is arranged in front (upstream) of the preheating block 412 for avoiding thermal transfer to the tape substrate 400 that is not heated by the preheating block 412. In addition, there is one preheating block 412 in the embodiment of FIG. 16(a) for the convenience of description.

In the structure thus constructed, a preheating block 412 is in contact with a predetermined block length of a circuit substrate of the tape substrate 400, and, when preheat of regions (1) to (3) is given as described in FIG. 10, the cooling block 411 is in contact with a predetermined block length of the circuit substrate of the tape substrate 400 to which the preheat of (1) is not supplied yet. At this time, the cooling block 411 is for cooling the tape substrate 400 to which preheat of (1) is not supplied yet, to the level of room temperature. Therefore, it is possible to avoid the rise in the temperature of the tape substrate 400 that is not heated yet by the preheating block 412.

Likewise, in the embodiment of FIG. 16(a), the cooling block 411 is in contact with a predetermined block length the circuit substrate of the tape substrate 400 to which preheat of (1) in FIG. 10 is not supplied yet to thereby cool down to a level of room temperature. A rise in temperature of the tape substrate 400 that is not heated by the preheating block 412 is avoided, to thereby carry out the quality of the product.

On the other hand, FIG. 16(b) includes a preheating block 512 to which preheat is supplied, a main heating block 514 to which peak heat is supplied and a cooling block 515 provided for lowering the temperature of the body to be heated to which peak heat is supplied. Besides, a cooling block 511 is arranged at the front part of the preheating block 512 for avoiding thermal transfer to the tape substrate 500 that is not heated yet by the preheating block 512, and a cooling block 513 is arranged between the preheating block 512 and main heating block 514 for avoiding thermal transfer to the tape substrate 500 that is not heated yet by the main heating block 514. Also, there is one preheating block 512 in the embodiment of FIG. 16(b) for the convenience of description.

In the structure thus constructed, when the main heating block 514 is in contact with a predetermined block length of the circuit substrate of the tape substrate 500 to provide peak heat, the cooling block 513 makes contact with a predetermined block length of the circuit substrate of the tape substrate 500 to which peak heat is not supplied yet, to cool off the circuit substrate. Therefore, it is possible to avoid a rise in temperature of the tape substrate 500 that is not heated yet by the heating block 514.

As described above, in the embodiment of FIG. 16(b), the cooling block 513 is cooled by contacting a predetermined block length of the circuit substrate of the tape substrate 500 to which peak heat is not supplied yet, so that a rise in temperature of the tape substrate 500 which is not heated yet by the main heating block 514 can be avoided to thereby readily achieve quality control of the product.

In the tenth embodiment, a description is made about a case that there is only one preheating block 512. However, it is not limited thereto, but there may be less or more heating blocks. If there are a plurality of preheating blocks 512, cooling blocks may be arranged therebetween to avoid a rise in the temperature of the subsequent tape substrate 500 when the preheat is applied, thereby readily improving the quality control of the product.

Figure 17:
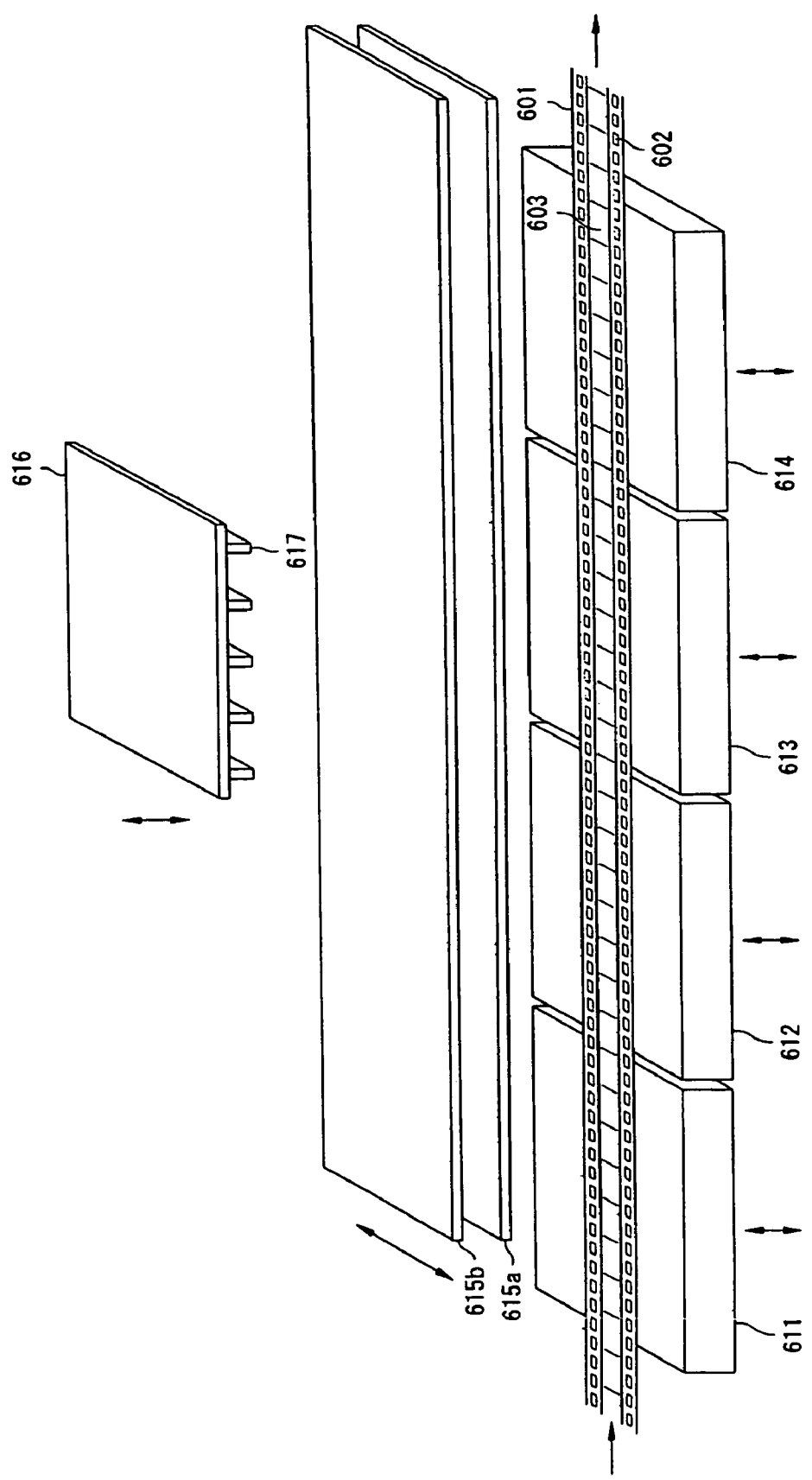
FIG. 17 illustrates an apparatus of manufacturing an electronic device according to an eleventh embodiment of the present invention.

FIG. 17 is a perspective view for illustrating the schematic structure of an apparatus for manufacturing an electronic device according to an eleventh embodiment of the present invention.

In FIG. 17, circuit blocks 603 are longitudinally arranged in a line on the tape substrate 601 for connection and an electronic component mounting area is provided at each of the circuit blocks 603. A predetermined pitch of a feed hole 602 is provided at both sides of the tape substrate 601 for transporting the tape substrate 601. Also, the tape substrate 601 may be made of polyimide or the like, for instance. Electronic components to be mounted to each of the circuit blocks 603 are, for instance, a semiconductor chip, chip condenser, resistor, coil, connector or the like.

On the other hand, in the reflow zone of the tape substrate 601, heating blocks 611 to 614 are arranged in parallel with a predetermined gap therebetween along the transport direction of the tape substrate 601. A pressing plate 616 having a downward projection 617 is arranged on the heating block 613. Shutter plates 615a and 615b are arranged next to the heating blocks 611 to 614.

At this time, the temperature of heating blocks 611, 612 can be set lower than the melting point to allow for a gradual increase. The temperature of the heating block 613 can be set to a temperature higher than the melting point. The temperature of the heating block 614 is set to be lower than the temperature of heating blocks 611, 612. The heating blocks 611 to 614 and pressing plate 616 can make individual and vertical movements, and the shutter plates 615a and 615b move horizontally in the shorter direction of the tape substrates 601. The heating blocks 611 to 614, shutter plates 615a and 615b and pressing plate 616 are supported to simultaneously slide along the direction of transporting the tape substrate 601. In addition, the gap between the projections 617 provided at the pressing plate 616 can be set in correspondence with the length of the circuit blocks 603.

The heating blocks 611 to 614 and shutter plates 615a and 615b are made of, for example, a member including metal, metal compounds or alloys, or ceramic. When the heating blocks 611 to 614 are made of steel or stainless steel, for instance, it is possible to restrict thermal expansion of the heating blocks 611 to 614 and precisely transport the tape substrate 601 to the heating blocks 611 to 614.

In addition, the length of heating blocks 611 to 614 can be respectively set in correspondence with that of a plurality of circuit blocks 603, and the size of the shutter plates 615a and 615b can be set to the sum of the size of the four heating blocks 611 to 614 and the gap therebetween. The size of pressing plate 616 can be set in correspondence with that of the heating block 613. The length of each heating block 611 to 614 is not necessarily set to n (an integer) times the length of one circuit block 603. The size may be set to a fraction thereof.

The shape of the heating blocks 611 to 614 is set such that at least the contact surface of the tape substrate 601 is flat (i.e., planar). For instance, the heating blocks 611 to 614 can be constructed in the shape of a plate.

Figure 18:
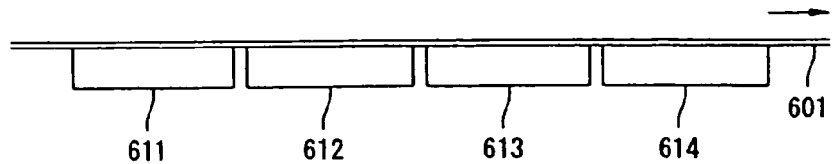
FIGS. 18(a)-(f) illustrate a reflow treatment of FIG. 17.
Figure 18:
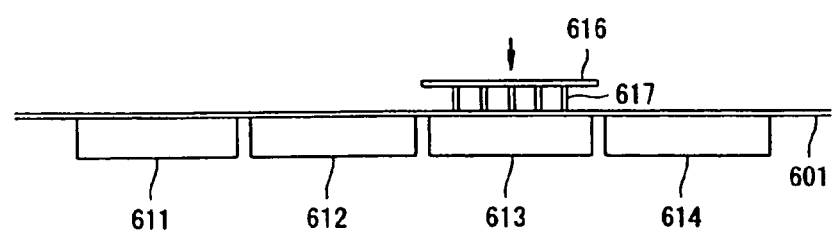
Figure 18:
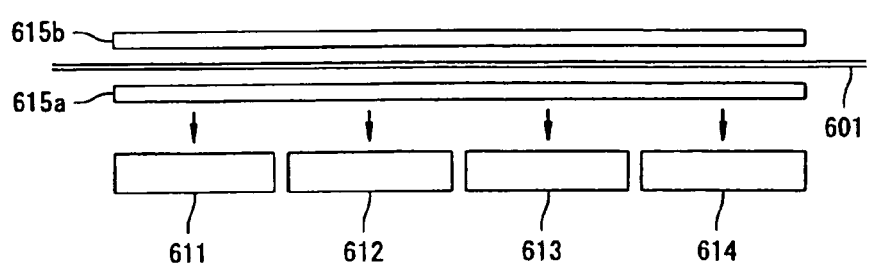
Figure 18:
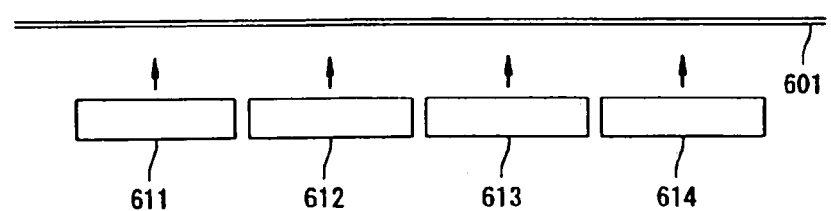
Figure 18:
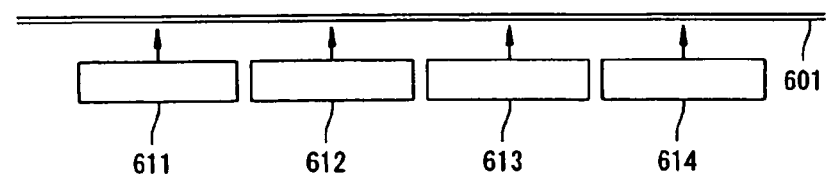
Figure 18:
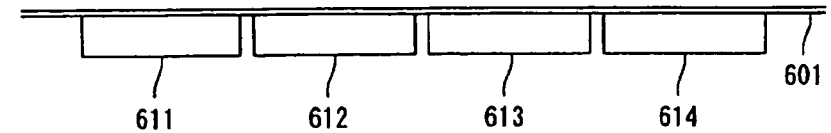
Figure 19:
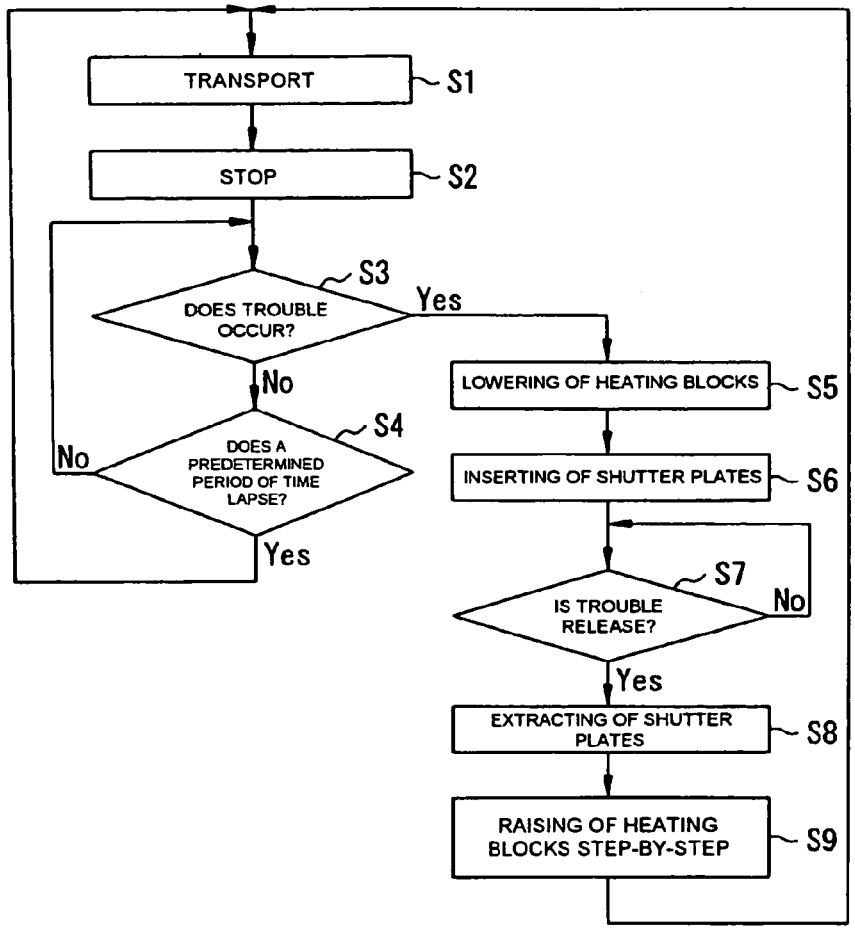
FIG. 19 is a flowchart for illustrating the reflow treatment of FIG. 17.

FIG. 18 is a side view for illustrating the reflow treatment of FIG. 17, and FIG. 19 is a flowchart for illustrating the reflow treatment of FIG. 17.

As shown in FIG. 18(a), for instance, the tape substrate 601 to which solder paste printing and electronic component mounting treatments are performed in the solder applying and mounting zones 22 and 23 of FIG. 3 is transported to the heating blocks 611 to 614 (step S1 in FIG. 19). Besides, if the tape substrate 601 is transported on the heating blocks 611 to 614, the tape substrate 601 can be transported in contact with the heating blocks 611 to 614. Therefore, when the tape substrate 601 is heated with the heating blocks 611 to 614 being in contact, it is possible to omit the movements of the heating blocks 611 to 614 and reduce the tact time of the reflow treatment. At this time, the heating blocks 611 to 614 are made in the shape of a plate, so that the tape substrate 601 can be smoothly transported in contact on the heating blocks 611 to 614.

Next, as shown in FIG. 18(b), when the tape substrate 601, to which solder paste printing and electronic component mounting treatments are performed, is transported to the heating blocks 611 to 614, the tape substrate 601 is stopped from being transported for only a predetermined period of time (steps S2 and S4 in FIG. 19) and then respectively heated by the heating blocks 611 to 614. At this time, the heating blocks 611 to 614 are arranged in parallel along the direction of transporting the tape substrate 601. The temperature of the heating blocks 611 and 612 is set for a gradual increase within a range that is less than a solder melting point while that of the heating block 613 is set to over the solder melting point. The temperature of the heating block 614 is set to-be lower than that of the heating blocks 611 and 612.

Therefore, a preliminary heating is carried out at the circuit block 603 over the heating blocks 611 and 612 and a main heating is carried out at the circuit block 603 over the heating block 613. A cooling can be made at the circuit block 603 over the heating block 614, and the preliminary heating, main heating or cooling can be made to the other circuit blocks 603 over the tape substrate 601 at one time.

At this time, when the tape substrate 601 is stopped on the heating blocks 611 to 614, the pressing plate 616 descends to the heating block 613 to press down the circuit block 603 over the heating block 613 using the projection 617. Thus, even when the tape substrate 601 is deformed in a wavy shape, heat can be evenly transmitted to the tape substrate 601 and the solder melting treatment can be made in stability. As the gap between the projections 617 corresponds to the length of the circuit block 603, it is possible to press down the circuit block 603 at the border of the circuit block 603 and prevent any mechanical damage to electronic components arranged at the circuit block.

Then, if a predetermined period of time elapses after the tape substrate 601 stops being transported, the tape substrate 601 is transported by only a predetermined length. As a particular circuit block 603 of the tape substrate 601 is sequentially stopped on the heating blocks 611 to 614 of the tape substrate 601, it is possible to sequentially perform the preliminary heating, main heating and cooling to the particular circuit block 603 of the tape substrate 601. Therefore, the temperature of a particular circuit block 603 of the tape substrate 601 can be raised step-by-step with restriction of thermal damage to the circuit block 603 for the reflow treatment. Besides, it is possible to rapidly lower the temperature of the soldered circuit block 603, limit thermal oxidation of the solder and improve product quality.

Besides, as the particular circuit block 603 of the tape substrate 601 sequentially contacts the heating blocks 611 to 614, it is possible to swiftly raise the circuit block 603 to a preset temperature by quickening the rise or drop of the temperature at the circuit block 603, while a difference in temperature of the borderlines is kept distinct, and efficiently perform the reflow treatment.

As shown in FIG. 3, even when the reflow treatment is continuously performed after the solder applying and mounting treatments on the same tape substrate 601, deterioration of manufacturing efficiency by the reason that the reflow limits the operational speed to delay the solder applying and mounting treatments, is prevented.

In other words, even when the solder applying and mounting treatments to circuit block 603 of the solder applying zone 22 and the mounting zone 23 are respectively finished, if the reflow treatment to the circuit block 603 in the reflow zone 24 is not finished, the tape substrate 601 cannot be transported until the reflow treatment to the circuit block of the reflow zone 24 is finished. Therefore, if a longer period of time is required for the reflow treatment than the solder applying and mounting treatment, the solder applying and mounting treatments are respectively needed to stand-by for the circuit block 603 of the solder applying zone 22 and mounting zone 23 until the reflow treatment to the circuit block 603 of the reflow zone is finished. The operational efficiency of the solder applying and mounting zones 22 and 23 gets lower, even deteriorating the manufacturing efficiency.

At this time, when the tape substrate 601 contacts the heating blocks 611 to 614, it is possible to swiftly change the temperature of the tape substrate 601 to a preset temperature and quicken the reflow treatment. As a result, even the solder applying, mounting and reflow treatments are performed at one time, to prevent the reflow treatment from getting slower to result in deterioration of the operational efficiency of the solder applying and mounting zones 22 and 23 and to improve the production efficiency.

Since a plurality of heating blocks 611 to 614 are arranged in parallel along the direction of transporting the tape substrate 601, it is possible to raise the temperature of the circuit block 603 step-by-step, without an increase in time relevant to the reflow treatment, and perform the reflow treatment with restriction on the thermal damage.

As a result, even when the solder applying, mounting and reflow processes are performed at one time, it is possible to achieve the optimization of the temperature profile in the reflow treatment while preventing the reflow treatment from getting slower, and improve production efficiency without deterioration of product quality.

At this time, the length of the tape substrate 601 to be transported by the one-time transport tact, for instance, can correspond to the length of the solder applied area to be applied by the one-time transport tact in the solder applying zone 22 of FIG. 3. The length of the solder applied area to be applied by the one-time transport tact can be set to a multiplication of an integer number of the length of a single circuit block 603.

Furthermore, a solder applying process is performed to a plurality of circuit blocks 603 simultaneously by the one-time transport tact in the solder applying zone 22 of FIG. 3, so that it is possible to perform the reflow treatment to a plurality of circuit blocks 603 as a whole step-by-step, avoid deterioration of the product quality and improve the production efficiency.

Moreover, the length of the solder applied area to be applied by the one-time transport tact is not necessarily identical to that of each of the heating blocks 611 to 614. Instead, the length of the heating blocks 611 to 614 may be greater than that of the solder applied area to be applied by the one-time transport tact. Therefore, if a change is made in the length of the circuit block 603 of the tape substrate 601, without any exchange of the heating blocks 611 to 614, it is possible to transport the tape substrate 601, while a particular circuit block 603 is heated on all of the heating blocks 611 to 614 for more than a predetermined period of time, and improve the production efficiency with restriction on deterioration of the product quality.

For instance, if the maximum length of a solder applied area to be applied by the one-time transport tact is 320 mm, the length of each of the heating blocks 611 to 614 can be set to 361 mm. Besides, one pitch of a feed hole 602 of FIG. 17 is 4.75 mm, and the length of one-time circuit block 603 can be changed within the scope of 6 to 15 pitches of the feed hole 602. In this case, the length of a solder applied area to be applied by the one-time transport tact is set to maximize the number of circuit blocks 603 within the range of the maximum value of 320 mm. For instance, if the length of one circuit block 603 is the length of 8 pitches of the feed hole 602, the length of the one circuit block 603 is as follows: 4.75.times.8=38 mm, and the length of the solder applied area to be applied by the one-time transport tact can be the length of eight times of the circuit block 603=304 mm.ltoreq.320 mm. Therefore, the length of the tape substrate 601 to be transported by the one-time transport tact can be set to 304 mm.

If the length of the heating blocks 611 to 614 is made greater than the length of the solder applied area to be applied by the one-time transport tact, and if the length of the tape substrate 601 to be transported by the one-time transport tact is set to the length of the solder applied area, at least one part of the same circuit block 603 is stopped on the same heating blocks 611 to 614 several times with occurrences where the heating time gets greater. Therefore, it is possible to maintain the quality of the reflow treatment by setting the temperature of the heating blocks 611 to 614 and the tact time to apply a margin to the heating time.

If the heating blocks 611 to 614 are arranged with a predetermined size of a gap, it is possible to distinctly maintain the bordering temperature between the heating blocks 611 to 614, to uniformly maintain the preset temperature even over all areas of the circuit block 603, and to constantly maintain the product quality at the time of the reflow treatment.

If the heating blocks 611 to 614 are arranged with a predetermined size of a gap therebetween, an insulating resin like Teflon (a registered trademark) may be provided at the gap between the heating blocks 611 to 614. The insulating resin can minimize the heat conduction between the heating blocks 611 to 614.

Next, as shown in FIG. 18(c), for instance, if trouble occurs at the solder applying zone 22 or mounting zone 23 in FIG. 3 (step S3 in FIG. 19), the position of the heating blocks 611 to 614 should be lowered down (step S5 in FIG. 19).

Furthermore, the shutter plates 615a and 615b are horizontally moved to be over the heating blocks 611 to 614, and inserted above and below the tape substrate 601 (step S6 in FIG. 19).

For instance, as trouble occurs at the solder applying zone 22 or mounting zone 23 in FIG. 3, and even if the tape substrate 601 is stopped from being transported for a long period of time, it is possible to prevent the tape substrate 601 from being unnecessarily heated for a longer period and reduce thermal oxidation or false contact of solder.

When the shutter plates 615a and 615b are inserted above and below the tape substrate 601, it is possible to make the distribution of temperature uniform at the upper and lower sides of the tape substrate 601 and prevent the tape substrate 601 from being deformed in a wavy shape.

Then, as shown in FIGS. 18(d) to 18(f), if the trouble occurring at the solder applying zone 22 or mounting zone 23, as shown in FIG. 3, is cured (step S7 in FIG. 19), the shutter plates 615a and 615b are removed (step S8 in FIG. 19). As the position of the heating blocks 611 to 614 is raised step-by-step (step S9 in FIG. 19), the heating blocks 611 to 614 are in contact with the tape substrate 601.

Since the heating blocks 611 to 614 are kept separated from the tape substrate 601 for a long period of time, it is possible to respectively raise the temperatures of the circuit block 603 on the heating blocks 611 to 614 step-by-step, even if the tape substrate 601 becomes cold over the heating blocks 611 to 614, while the tape substrate 601 is stopped from being transported.

Since the temperature of the circuit block 603 on the heating blocks 611 to 614 is raised step-by-step, the tape substrate 601 need not be taken up in the reverse direction to have a process of being transported or complication of the transport system, thereby making it possible to re-start the reflow treatment.

In the aforementioned embodiment, if the tape substrate 601 needs to be removed from heating, a description is made about a method of retracting all the heating blocks 611 to 614 from the tape substrate 601. However, for instance, only the heating block 613 may be retracted from the tape substrate 601 while the heating blocks 611, 612 and 613 remain in contact with the tape substrate 601. For instance, if trouble occurs at the solder applying zone 22 or mounting zone 23 in FIG. 3 and if the tape substrate 601 is stopped for a long time, it is possible to continuously supply preheat to the circuit block 603 of the tape substrate 601 and stop supplying main heat, thereby reducing product defects.

In the embodiment of FIG. 17, there is a method of arranging four heating blocks in parallel. However, there may be more than four heating blocks 611 to 614 arranged in parallel. The preheating treatment may be performed to the circuit block 603 more gradually. The cooling process of the circuit blocks 603 can be performed step-by-step.

In addition, a description is made about a method for constructing each of the heating blocks 611 to 614 as a plate. The contact surface of the heating blocks 611 to 614 may also have a concave portion for contacting with the area where a semiconductor chip is arranged, thereby making it possible to prevent the heating blocks 611 to 614 from directly contacting the chip. Therefore, it is possible to restrict thermal damage to the semiconductor chip that is not heat resistant but mounted on the tape substrate 601.

Figure 20:
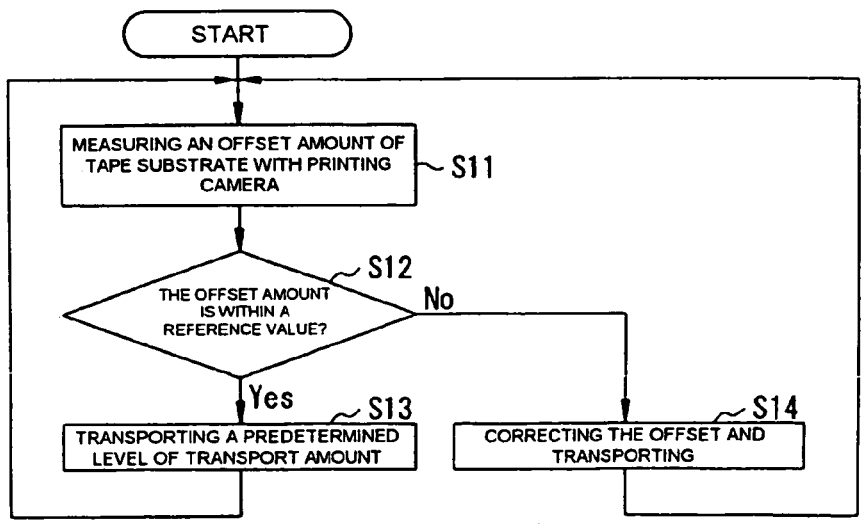
FIG. 20 is a flowchart for illustrating a transport treatment of FIG. 17.

FIG. 20 is a flowchart for illustrating a transport treatment of FIG. 17.

In FIG. 20, an image of the tape substrate 601 is taken by a camera provided at the solder applying zone 22, and the offset amount of the tape substrate 601 is measured (step S11).

Then, it is determined whether the offset amount of the tape substrate 601 measured by the camera is within a reference value thereof or not (step S12). If the offset amount of the tape substrate 601 falls within the reference value, the tape substrate 601 is transported by a predetermined amount (step S13). If the offset amount of the tape substrate 601 falls out of the reference value, a correction is made to transport the tape substrate 601 (step S14).

A mark can be provided at each circuit block 603 to check the offset in the tape substrate 601. Then, it can be determined whether the offset amount of the tape substrate 601 is within the reference value by checking whether the mark is within the regulated frame.

Figure 21:
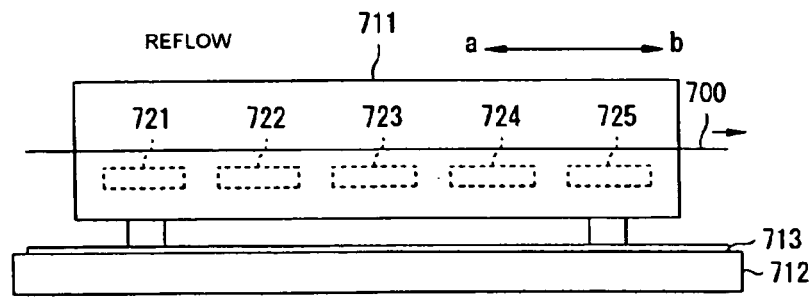
FIGS. 21(a)-(c) illustrate a method of manufacturing an electronic device according to a twelfth embodiment of the present invention.
Figure 21:
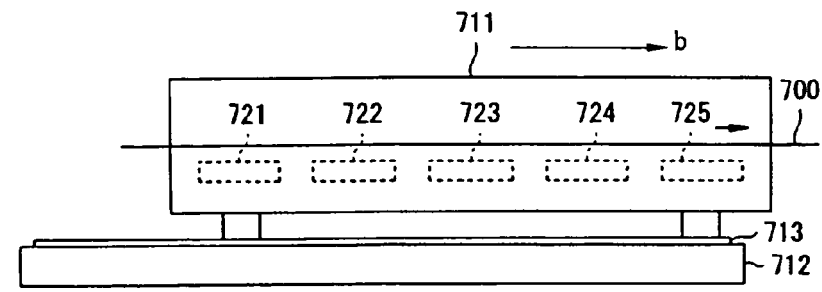
Figure 21:
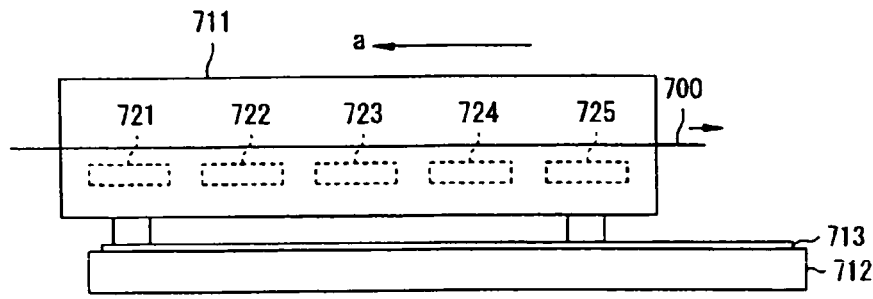

FIG. 21 is a side view for illustrating an apparatus for manufacturing an electronic device according to the twelfth embodiment of the present invention.

In FIG. 21(a), the reflow furnace 711 is supported by a supporting stand 712 having a rail 713. In this case, the reflow furnace 711 is to perform heating or cooling treatment to a circuit substrate as a body to be heated placed in a line on the tape substrate 700 in a reflow process to be performed after solder applying and mounting processes. The reflow furnace 711 includes heater zones 721 to 724 to raise the temperature of the circuit substrate step-by-step and a cooling zone 725 to lower the temperature of the circuit substrate. The reflow furnace 711 can process a plurality of circuit substrates placed in a line on the tape substrate 700 as a whole or one circuit substrate at a time.

The reflow furnace 711, as shown in FIGS. 21(b) and (c), can be freely moved in the direction of arrow a-b along the rail 713 of the supporting stand 712. The arrow direction a-b follows the direction of transport of the tape substrate 700. Likewise, the reflow furnace 711 can be moved in the direction of arrow a-b, so that the heater zones 721 to 724 and the cooling zone 725 may be positioned at positions corresponding to the product pitch of a circuit substrate.

Figure 22:
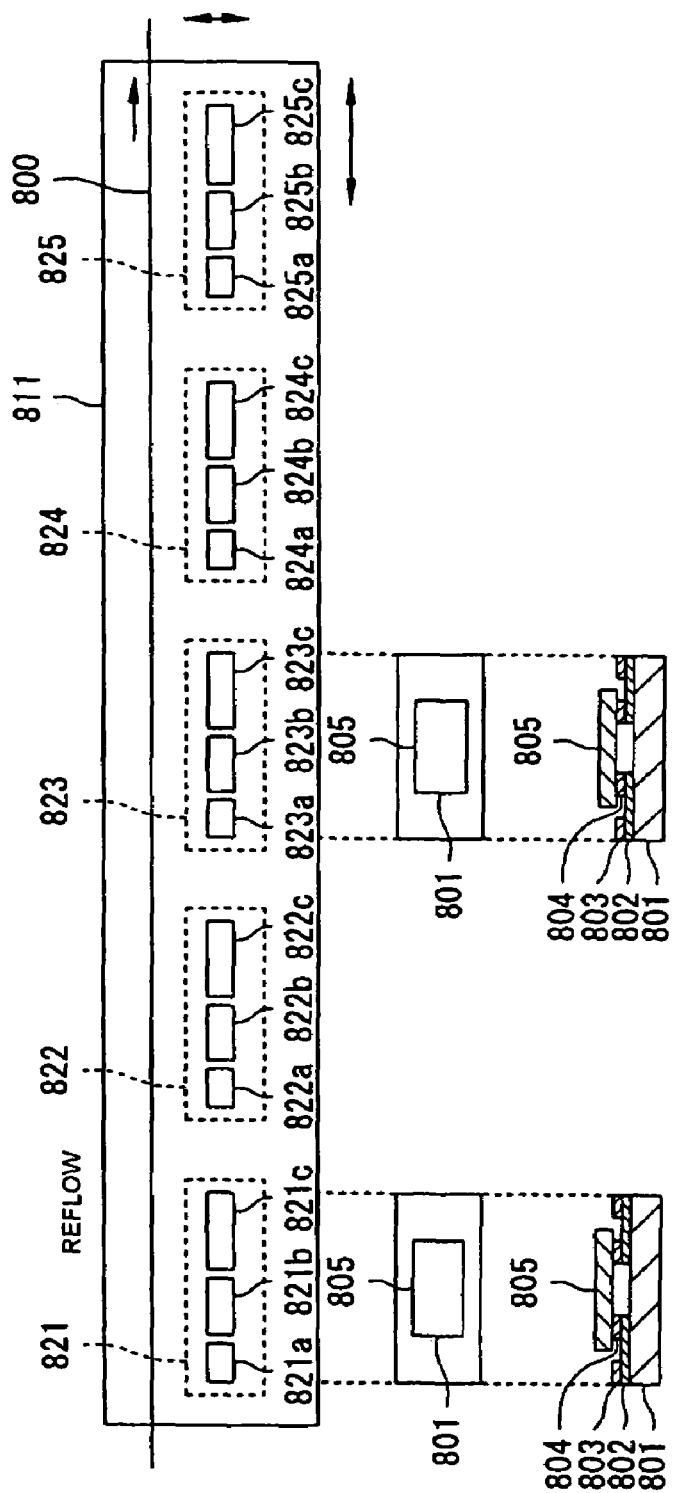
FIG. 22 illustrates a method of manufacturing an electronic device according to a thirteenth embodiment of the present invention.
Figure 23:
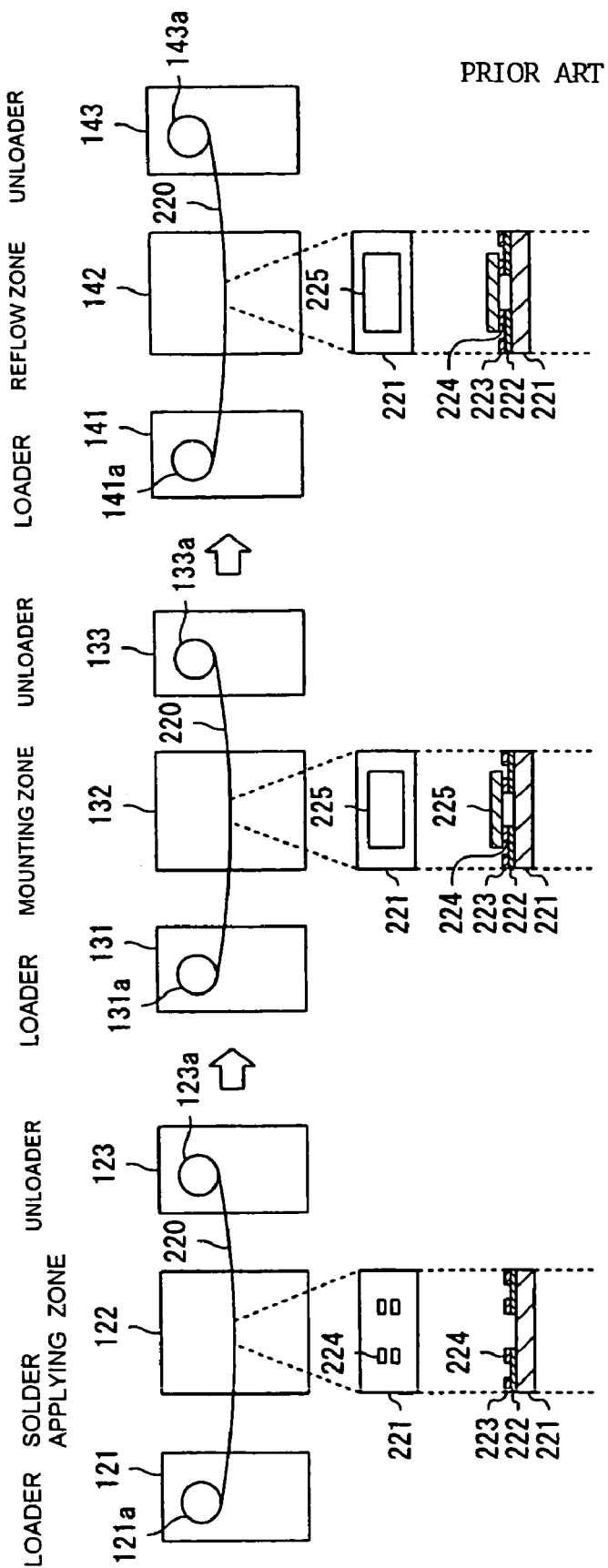
FIG. 23 illustrates a conventional method of manufacturing an electronic device.

FIG. 22 illustrates a method of manufacturing an electronic device according to a thirteenth embodiment of the present invention.

In FIG. 22, a reflow furnace 811 can be moved along a direction of transport of a tape substrate 800. The reflow furnace 811 includes heater zones 821 to 824 and a cooling zone 825. The circuit substrate 801 is placed in a line on the tape substrate 800 as a continuous body to be transported in the right arrow direction by a predetermined tact. At this time, in the circuit substrate 801, a solder paste 804 is attached on a wiring 802 of the circuit substrate 801 in a solder applying treatment before a reflow treatment. Also, an adhesive like ACF is attached on the wiring 802 by transcription. Reference numeral 803 is an insulating film. In the mounting process after the solder applying, a semiconductor chip 805 is mounted to the circuit substrate 801 using the solder paste 804.

In the heater zones 821 to 824 and cooling zone 825 of the reflow furnace 811, there are heating blocks 821a to 821c, 822a to 822c, 823a to 823c, and 824a to 824c and cooling blocks 825a to 825c which are aligned with the product pitch of the circuit substrate 801. The product pitch means a load gap in an IC mounted on the circuit substrate 801, for instance, a multiplication of an integer number of 4.75 mm. At this time, if fixed numbers are x, y and z (x<y<z), and the product pitch is (4.75.multidot.x), the heating blocks 821a, 822a, 823a and 824a, and the cooling blocks 825a are in correspondence. If the product pitch is (4.75.multidot.y), the heating blocks 821b, 822b, 823b and 824b and the cooling block 825b are in correspondence. If the product pitch is (4.75.multidot.z), the heating blocks 821c, 822c, 823c and 824c and the cooling block 825c are in correspondence.

The heating blocks 821a to 821c, 822a to 822c, 823a to 823c, and 824a to 824c and the cooling blocks 825a to 825c are individually and vertically moved by a driving mechanism (not shown). In other words, if what matches with the product pitches of the circuit substrate 801 are heating blocks 821a, 822a, 823a and 824a and the cooling block 825a, the heating blocks 821a, 822a, 823a and 824a and the cooling block 825a are raised higher by a driving mechanism (not shown) and contact a predetermined block length of the circuit substrate 801 of the tape substrate 800, thereby performing a heating or cooling treatment.

Any one of the heating blocks 821a to 821c, 822a to 822c, 823a to 823c, and 824a to 824c and the cooling blocks 825a to 825c is in contact with a predetermined block length of the circuit substrate 801 of the tape substrate 800 for a predetermined period of time to complete the heating or cooling treatment, they are moved down and separated from the tape substrate 800. Any one of the heating blocks 821a to 821c, 822a to 822c, 823a to 823c, and 824a to 824c and the cooling blocks 825a to 825c is vertically moved and the tape substrate 800 is transported in the direction of the right arrow to thereby sequentially apply preheat, peak heat and cooling to the circuit substrate 801.

At this time, the heating blocks 821a to 821c apply the preheat to the tape substrate 800 as shown with the solid line in region (1) in FIG. 10. The heating blocks 822a to 822c apply preheat to the tape substrate 800 as shown with the solid line in region (2) in FIG. 10. The heating blocks 823a to 823c apply preheat to the tape substrate 800 as shown with the solid line in region (3) in FIG. 10. The heating blocks 824a to 824c apply, as shown with the solid line in region (4) in FIG. 10, peak heat of solder melting point+α. The cooling blocks 825a to 825c drop, as shown by the solid line in region (5) in FIG. 10, the temperature of the tape substrate 800.

For instance, the tape substrate 800 to which the solder applying and mounting processes are completed proceeds to the reflow process, the heat zones 821 to 824 and the cool zone 825 perform heating or cooling treatment to the predetermined block length of the circuit substrate 801 of the tape substrate 800. At this time, if what matches with the product pitch of the circuit substrate 80 is the heating blocks 821a, 822a, 823a and 824a and the cooling block 825a, the reflow furnace 800 slides along the direction of transporting the tape substrate 800, and the heating blocks 821a, 822a, 823a and 824a and the cooling block 825a are fixed at a position that corresponds to the product pitch of the tape substrate 800.

Next, the heating blocks 821a, 822a, 823a and 824a and cooling block 825a are raised to contact the tape substrate 800. At this time, first of all, the heating block 821a is in contact with the predetermined block length of the circuit substrate 801 of the tape substrate 800 for a predetermined period of time for the heating treatment. Thus, the preheat is applied to the circuit substrate 801 as shown with the solid line in region (1) in FIG. 10.

The heating is completed by the heating block 821a for a predetermined period of time, the heating blocks 821a, 822a, 823a and 824a and the cooling block 825a are separated from the tape substrate 800. Next, the tape substrate 800 is transported in the direction of the right arrow. The transport stroke is matched with the predetermined block length of the circuit substrate 801 of the tape substrate 800. The circuit substrate 801 to which heating treatment is completed by the heating block 821a reaches the position of the heating block 822a, the tape substrate 800 stops being transported, and the heating blocks 821a, 822a, 823a and 824a and the cooling block 825a are raised again.

At this time, the heating treatment is performed to the predetermined block length of the circuit substrate of the tape substrate 800 by the heating block 822a by being in contact for a predetermined period of time. Thus, the preheat is applied to the circuit substrate 801 as shown with the solid line in region (2) of FIG. 10.

When the heating is completed by the heating block 822a for a predetermined period of time, the heating blocks 821a, 822a, 823a and 824a and the cooling block 825a are separated from the tape substrate 800. Next, the tape substrate 800 is transported in the direction of the right arrow. The circuit substrate 801 to which the heating treatment is completed by the heating block 822a reaches the position of the heating block 823a, the process of transporting the tape substrate 800 in the direction of the right arrow is stopped. Then, the heating blocks 821a, 822a, 823a and 824a and the cooling block 825a are raised again. At this time, the heating block 823a is in contact with the predetermined block length of the circuit substrate 801 of the tape substrate 800 for a predetermined period of time to perform the heating. Then, the preheat is applied to the circuit substrate 801 as shown with the solid line in region (3) in FIG. 10.

When the heating treatment is completed to the heating block 823a, the heating blocks 821a, 822a, 823a and 824a and the cooling block 825a are separated from the tape substrate 800. Next, the tape substrate 800 is transported in the right arrow direction. When the circuit substrate 801 completely heated by the heating block 823a reaches the position of the heating block 824a, it stops being transported in the right arrow direction of the tape substrate 800, and the heating blocks 821a, 822a, 823a and 824a and the cooling block 825a rise again. At this time, the heating block 824a heats the predetermined block length of the circuit substrate 801 of the tape substrate 800 in contact for a predetermined period of time. Therefore, the circuit substrate 801 is heated with peak heat, as shown with the solid line in region (4) in FIG. 10, so that the solder paste 804 is melted to bond the semiconductor chip 805 to the wiring 802 of the circuit substrate 801.

When the heating treatment for a predetermined period of time is completed by the heating block 824a, the heating blocks 821a, 822a, 823a and 824a and the cooling block 825a are separated from the tape substrate 800. Next, the tape substrate 800 is transported in the right arrow direction. The heat substrate 800 completely heated by the heating block 824a reaches the position of the cooling block 825a, the tape substrate 800 stops being transported in the right arrow direction, and the heating blocks 821a, 822a, 823a and 824a and cooling block 825a rise again. At this time the cooling block 825a performs the cooling treatment to the predetermined block length of the circuit substrate 801 of the tape substrate 800 in contact for a predetermined period of time. Therefore, the temperature of the circuit substrate 801, as shown with the solid line in region (5) in FIG. 10, lowers to fix the semiconductor chip 805 at the wiring 802. As described above, the tape substrate 800 is transported in the right arrow direction for application of preheat, peak heat and cool to the predetermined block length of circuit substrate sequentially to complete the reflow process to the circuit substrate 801.

When what is matched with the product pitch of the circuit substrate 801 is, for instance, the heating blocks 821c, 822c, 823c and 824c and the cooling block 825c, the reflow furnace 811 slides down along the direction of transporting the tape substrate 800, the heating blocks 821c, 822c, 823c and 824c and the cooling block 825c are fixed at the position which matches with the product pitch of the circuit substrate 801, as described above, to perform heating and cooling to the predetermined block length of the circuit substrate 801 of the tape substrate 800.

In the reflow process described above, any one of the heating blocks 821a to 821c, 822a to 822c, 823a to 823c, and 824a to 824c and the cooling blocks 825a to 825c matched with the product pitch is in contact with the tape substrate 800, so that it is possible to sequentially apply preheat and peak heat to the tape substrate 800 being transported by the predetermined tact, as shown with the preheat (1) to (3) and peak heat (4) in FIG. 10.

Likewise, in the thirteenth embodiment, the reflow furnace 811 is slid along the direction of transport of the tape substrate 800 and fixes at the position which matches with the product pitch of the circuit substrate 801, to get any one of the heating blocks 821a to 821c, 822a to 822c, 823a to 823c, and 824a to 824c and the cooling blocks 825a to 825c matched with the product pitch of the circuit substrate 801.

Therefore, it becomes unnecessary to set the heating time to each circuit substrate 801 having different product pitches, and the reflow treatment can be continuously performed to the tape substrate 800 having circuit substrates having different product pitches, thereby improving the productivity.

Besides, since any one of the heating blocks 821a to 821c, 822a to 822c, 823a to 823c, and 824a to 824c and the cooling blocks 825a to 825c matching with the product pitches is in contact with the circuit substrate 801 to perform the heating treatment, the heating treatment is different from the conventional method for heating spots, but can be performed to the unit of several circuit substrates 801.

Also, in the embodiment of the present invention, four heat zones are provided, but it is not limited thereto, and there may be less or more heat zones.

Besides, a description is made about a case where the respective heat zones 821 to 824 includes three heating blocks 821a to 821c, 822a to 822c, 823a to 823c, and 824a to 824c, but it is not limited thereto, there may be less than more than four heating blocks.

The entire disclosure of Japanese Patent Application Nos. 2002-081220 filed Mar. 22, 2002, 2002-081221 filed Mar. 22, 2002, 2002-081222 filed Mar. 22, 2002, 2002-081223 filed Mar. 22, 2002, 2002-084347 filed Mar. 25, 2002, and 2003-024649 filed Jan. 31, 2003 are incorporated by reference.

What is claimed is:

1. A method for manufacturing an electronic device, the method comprising:
   applying a conductive material to a plurality of electronic component mounting areas of a continuous body while transporting the continuous body with a transporting means;
   mounting a plurality of electronic components on the plurality of electronic component mounting areas where the conductive material is applied while transporting the continuous body with the transporting means; and
   performing a reflow treatment on the continuous body after the mounting of the plurality of electronic components in order to fix the plurality of electronic components on the continuous body via the conductive material, the performing the reflow treatment being executed while transporting the continuous body with the transporting means.

2. The method for manufacturing an electronic device according to claim 1, further comprising:
   after the performing the reflow treatment, performing a circuit block cutting treatment on the continuous body while transporting the continuous body with the transporting means.

3. The method for manufacturing an electronic device according to claim 1, the performing the reflow treatment including raising a temperature of an area to be heated of the continuous body by at least one of approaching and contacting at least part of the area to be heated with a heat generating device.

4. The method for manufacturing an electronic device according to claim 3, the performing the reflow treatment further including simultaneously contacting a plurality of circuit blocks with the heat generating device.

5. The method for manufacturing an electronic device according to claim 3, the performing the reflow treatment further including repeatedly contacting one of a plurality of circuit blocks with the heat generating device.

6. The method for manufacturing an electronic device according to claim 3, the performing the reflow treatment further including:
   transporting a first area to be heated of said continuous body to said heat generating device;
   raising a temperature of said first area to be heated by contacting said first area to be heated with said heat generating device;
   transporting a second area to be heated of said continuous body to said heat generating device; and
   raising a temperature of said second area to be heated by contacting said second area to be heated with said heat generating device.

7. The method for manufacturing an electronic device according to claim 3, the performing the reflow treatment further including retracting the heat generating device from the area to be heated, the retracting occurring at least one of during and after the raising said temperature of the area to be heated with the heat generating device.

8. The method for manufacturing an electronic device according to claim 3, the performing the reflow treatment further including:
   adjusting a length of the heat generating device such that the length of the heat generating device corresponds to a product pitch on the continuous body.

9. The method for manufacturing an electronic device according to claim 8, the performing the reflow treatment further including:
   sliding a supporting stand supporting the heat generating device along a transport direction of the continuous body such that a position of the heat generating device corresponds to the product pitch.

10. The method for manufacturing an electronic device according to claim 1, the performing the reflow treatment further including:
    transporting a first area to be heated of the continuous body to a first heat generating device and a second area to be heated of the continuous body to a second heat generating device, a temperature of the second heat generating device being higher than a temperature of the first heat generating device; and
    raising a temperature of the first area to be heated by contacting the first area to be heated with the first heat generating device, and raising a temperature of the second area to be heated higher than the first area to be heated by contacting the second area to be heated with the second heat generating device.

11. The method for manufacturing an electronic device according to claim 10, the first and second heat generating devices being arranged in parallel along the transport direction of the continuous body such that the first heat generating device is upstream of the second heat generating device.

12. The method for manufacturing an electronic device according to claim 10, the performing the reflow treatment further including:
    retracting the second heat generating device from the second area to be heated, the retracting occurring at least one of during and after the first and second areas to be heated are heated by the first and second heat generating devices.

13. The method for manufacturing an electronic device according to claim 12, the performing the reflow treatment further including:
    re-contacting the second heat generating device with the second area to be heated after the retracting.

14. The method for manufacturing an electronic device according to claim 13, the performing the reflow treatment further including:
    blowing hot air toward the second area to be heated before re-contacting the second heat generating device with the second area to be heated.

15. The method for manufacturing an electronic device according to claim 1, further comprising:
before applying the conductive material, unwiring a continuous body with an unwiring means and transporting the continuous body with a transporting means.

16. The method for manufacturing an electronic device according to claim 1, further comprising:
after the performing of the reflow treatment, taking up the continuous body with a take-up means.

17. The method for manufacturing an electronic device according to claim 1, further comprising:
after the performing of the reflow treatment, performing a resin sealing treatment on the continuous body while transporting the continuous body with the transporting means.

18. The method for manufacturing an electronic device according to claim 1, the mounting the plurality of electronic components including mounting a first part of the plurality of electronic components on a first area of the plurality of electronic component mounting areas at a first mounting zone, and mounting a second part of the plurality of electronic components on a second area of the plurality of electronic component mounting areas at a second mounting zone after the mounting the first part of the plurality of electronic components.

19. A method for manufacturing an electronic device, the method comprising:
applying a conductive material to a plurality of electronic component mounting areas of a continuous body while transporting the continuous body with a transporting means;
mounting a plurality of electronic components on the plurality of electronic component mounting areas where the conductive material is applied while transporting the continuous body with the transporting means; and
performing a reflow treatment on the continuous body after the mounting of the plurality of electronic components while transporting the continuous body with the transporting means;
the performing the reflow treatment including:
transporting an area to be heated of the continuous body to a heat generating device; and
incrementally raising the temperature of the area to be heated by controlling a distance between the heat generating device and the area to be heated.

20. A method for manufacturing an electronic device, the method comprising:
applying a conductive material to a plurality of electronic component mounting areas of a continuous body while transporting the continuous body with a transporting means;
mounting a plurality of electronic components on the plurality of electronic component mounting areas where the conductive material is applied while transporting the continuous body with the transporting means; and
performing a reflow treatment on the continuous body after the mounting of the plurality of electronic components while transporting the continuous body with the transporting means;
the performing the reflow treatment including:
raising a temperature of an area to be heated of the continuous body by at least one of approaching and contacting at least part of the area to be heated with a heat generating device;
retracting the heat generating device from the area to be heated, the retracting occurring at least one of during and after of the raising the temperature of the area to be heated with the heat generating device; and
inserting a heat shielding plate between the retracted heat generating device and the area to be heated.

21. A method for manufacturing an electronic device, the method comprising:
applying a conductive material to a plurality of electronic component mounting areas of a continuous body while transporting the continuous body with a transporting means;
mounting a plurality of electronic components on the plurality of electronic component mounting areas where the conductive material is applied while transporting the continuous body with the transporting means; and
performing a reflow treatment on the continuous body after the mounting of the plurality of electronic components while transporting the continuous body with the transporting means;
the performing the reflow treatment including:
raising a temperature of an area to be heated of the continuous body by at least one of approaching and contacting at least part of the area to be heated with a heat generating device;
retracting the heat generating device from the area to be heated, the retracting occurring at least one of during and after the raising of the temperature of the area to be heated with the heat generating device; and
re-contacting the heat generating device with the area to be heated after the retracting.

22. The method for manufacturing an electronic device according to claim 21, the performing the reflow treatment further including blowing hot air toward the area to be heated before re-contacting the heat generating device with the area to be heated.

* * * * *